(12) United States Patent
Batzler et al.

(10) Patent No.: US 8,868,378 B2
(45) Date of Patent: Oct. 21, 2014

(54) POWER MONITORING SYSTEM

(75) Inventors: Brandon M. Batzler, Hartford, WI (US); Kenny J. Stair, North Prairie, WI (US); Russell C. Nordman, Sussex, WI (US); John A. Fiorenza, Slinger, WI (US); Wesley C. Sodemann, Dousman, WI (US)

(73) Assignee: Briggs and Stratton Corporation, Milwaukee, WI (US)

( * ) Notice: Subject to any disclaimer, the term of this patent is extended or adjusted under 35 U.S.C. 154(b) by 438 days.

(21) Appl. No.: 12/441,549

(22) PCT Filed: Sep. 17, 2008

(86) PCT No.: PCT/US2008/076638
§ 371 (c)(1),
(2), (4) Date: Mar. 26, 2009

(87) PCT Pub. No.: WO2009/039155
PCT Pub. Date: Mar. 26, 2009

(65) Prior Publication Data
US 2009/0240377 A1 Sep. 24, 2009

Related U.S. Application Data

(60) Provisional application No. 60/973,623, filed on Sep. 19, 2007, provisional application No. 61/022,862, filed on Jan. 23, 2008, provisional application No. 61/027,553, filed on Feb. 11, 2008.

(51) Int. Cl.
| | | |
|---|---|---|
| *G06F 11/00* | (2006.01) | |
| *G06Q 10/06* | (2012.01) | |
| *G05B 23/02* | (2006.01) | |
| *H02J 9/08* | (2006.01) | |
| *G01R 22/06* | (2006.01) | |

(52) U.S. Cl.
CPC ............... *G05B 23/0216* (2013.01); *H02J 9/08* (2013.01); *G06Q 10/06* (2013.01); *G01R 22/063* (2013.01)
USPC .......................................................... 702/188

(58) Field of Classification Search
CPC ...................................................... G05B 23/02
USPC ........................................................ 702/188
See application file for complete search history.

(56) References Cited

U.S. PATENT DOCUMENTS

| | | |
|---|---|---|
| 6,188,145 B1 | 2/2001 | Stewart |
| 6,255,805 B1 | 7/2001 | Papalia et al. |

(Continued)

FOREIGN PATENT DOCUMENTS

| | | |
|---|---|---|
| WO | 9855934 A | 12/1998 |
| WO | 0182260 A | 11/2001 |
| WO | 2005091460 A | 9/2005 |

OTHER PUBLICATIONS

Akl et al., "Cryptographic Solution to a Problem of Access Control in Hierarchy", 1983, sactions on Computer Systems, vol. 1, No. 3 pp. 239-248: http://delivery.acm.org/10.1145/360000/357372/p239-akl.pdf?ip=151.207.250.61&id=357372&acc=ACTIVE%20SERVICE&key=986B26D8D17D60C8AAC6AC1B60173C4E&CFID=272057976&CFTOKEN=73480609&_acm_=1387376141_c49236bce.*

(Continued)

*Primary Examiner* — Jonathan C Teixeira Moffat
*Assistant Examiner* — Regis Betsch
(74) *Attorney, Agent, or Firm* — Michael Best & Friedrich LLP

(57) ABSTRACT

The invention provides a hierarchically accessible monitoring system configured to be used with a standby generator, and a method of remotely accessing generator information from a standby generator. The hierarchically accessible monitoring system includes an interface unit configured to receive information from the standby generator and to communicate the generator information, and a remote data server in communication with the interface unit. The remote data server receives the generator information from the interface unit, stores the generator information, and controls access to the generator information based upon at least two hierarchical levels, each hierarchical level having different access privileges. The hierarchically accessible monitoring system also includes a user interface configured to display the generator information from the remote data server to at least one user. The user has access privileges to read the generator information based upon the user's assigned hierarchical level.

21 Claims, 35 Drawing Sheets

| PARAMETER | DESCRIPTION | DEFAULT | ACCESS PRIVILEGE | |
|---|---|---|---|---|
| | | | CUSTOMER | INSTALLER |
| CONFIGURATION PARAMETERS | | | | |
| MODEL # OF GENERATOR | MODEL NUMBER OF GENERATOR | 0 | R/O | R/W |
| SERIAL # OF GENERATOR | SERIAL NUMBER OF GENERATOR | 0 | R/O | R/W |
| MODEL # OF TRANSFER SWITCH | MODEL NUMBER OF TRANSFER SWITCH | 0 | R/O | R/W |
| SERIAL # OF TRANSFER SWITCH | SERIAL NUMBER OF TRANSFER SWITCH | 0 | R/O | R/W |
| TRANSFER SWITCH SOFTWARE REVISION | | 0 | R/O | R/W |
| DEVICE NAME | USER FRIENDLY NAME FOR THE DEVICE | NONE | R/W | R/W |
| INSTALLATION DATE | ONE FIELD FOR EACH OF GENERATOR, TRANSFER-SWITCH AND BIU. DEALER CAN ONLY SET EACH ONE ONCE. ADMIN CAN CHANGE AT ANY TIME. | NONE | R/O | R/W |
| DEALER CONTACT INFORMATION | CONTACT INFO FOR DEALER WHERE SYSTEM WAS PURCHASED | NONE | R/O | R/W |
| ELECTRICAL INSTALL CONTACT INFORMATION | CONTACT INFO FOR COMPANY/PERSON THAT DID ELECTRICAL WORK | NONE | R/O | R/W |
| GAS SUPPLY INSTALL CONTACT INFORMATION | CONTACT INFO FOR COMPANY/PERSON THAT INSTALLED GAS FEED | NONE | R/O | R/W |
| CURRENT OWNER INFORMATION | CONTACT INFO FOR PERSON WHO CURRENTLY OWNS THE GENERATOR SYSTEM | NONE | R/W | R/W |
| CURRENT CONTACT INFORMATION | CONTACT INFO FOR PERSON WHO MANAGES THE GENERATOR SYTEM | NONE | R/W | R/O |
| SYSTEM PARAMETERS | | | | |
| AUTO UPGRADE | WHETHER OR NOT TO AUTOMATICALLY UPGRADE WHEN THERE IS NEW SYSTEM SOFTWARE | ENABLED | R/O | R/O |
| POLL INTERVAL | DEFAULT TIME IN SECONDS BETWEEN POLLING OPERATIONS | 300 | R/O | R/O |
| NETWORK PARAMETERS | | | | |
| CENTRAL MANAGEMENT SERVER ADDRESS | NAME OF CENTRAL MANAGEMENT SERVER | SERVER.BRIGGSANDSTRATTON.COM | R/O | R/O |
| CENTRAL MANAGEMENT SERVER IP | IP ADDRESS OF DEFAULT SERVER IF DNS FAILS | TBD | R/O | R/O |
| IP ADDRESS METHOD | METHOD TO USE TO GET LOCAL IP ADDRESS (DHCP/STATIC) | DHCP | R/W | R/W |
| IP ADDRESS | CURRENT IP ADDRESS | 000.000.0.000 | R/W(MANUAL MODE) | R/W(MANUAL MODE) |
| SUBNET MASK | CURRENT SUBNET MASK | 000.000.000.000 | R/W(MANUAL MODE) | R/W(MANUAL MODE) |
| DEFAULT GATEWAY | CURRENT DEFAULT GATEWAY | 000.000.000.0 | R/W(MANUAL MODE) | R/W(MANUAL MODE) |
| DNS SERVER | IP ADDRESS OF THE DNS SERVER | 0.0.0.0 | R/W(MANUAL MODE) | R/W(MANUAL MODE) |

(56) References Cited

U.S. PATENT DOCUMENTS

| | | |
|---|---|---|
| 6,376,937 B1 | 4/2002 | Stewart |
| 6,549,130 B1 | 4/2003 | Joao |
| 6,563,233 B1 | 5/2003 | Hinks |
| 6,633,823 B2 | 10/2003 | Bartone et al. |
| 6,653,821 B2 | 11/2003 | Kern et al. |
| 6,798,187 B1 | 9/2004 | Czarnecki |
| 6,850,820 B2 | 2/2005 | Tajima |
| 6,882,904 B1 | 4/2005 | Petrie et al. |
| 6,912,889 B2 | 7/2005 | Staphanos et al. |
| 6,983,640 B1 * | 1/2006 | Staphanos et al. ........... 73/23.31 |
| 7,015,599 B2 | 3/2006 | Gull et al. |
| 7,072,801 B2 * | 7/2006 | James ........................ 702/188 |
| 7,230,345 B2 | 6/2007 | Winnie et al. |
| 2002/0035497 A1 | 3/2002 | Mazeereeuw et al. |
| 2003/0023477 A1* | 1/2003 | Fergusson et al. .............. 705/11 |
| 2003/0075982 A1 | 4/2003 | Seefeldt |
| 2003/0172161 A1* | 9/2003 | Rymon ........................ 709/226 |
| 2003/0218549 A1 | 11/2003 | Logvinov et al. |
| 2003/0224833 A1 | 12/2003 | Egan et al. |
| 2004/0024717 A1 | 2/2004 | Sneeringer |
| 2004/0078153 A1 | 4/2004 | Bartone et al. |
| 2004/0252053 A1* | 12/2004 | Harvey ................... 342/357.15 |
| 2004/0262997 A1 | 12/2004 | Gull et al. |
| 2005/0142415 A1* | 6/2005 | James .......................... 429/34 |
| 2005/0188745 A1 | 9/2005 | Staphanos et al. |
| 2005/0225441 A1* | 10/2005 | Kernan ........................ 340/506 |
| 2005/0278075 A1* | 12/2005 | Rasmussen et al. .......... 700/286 |
| 2006/0018069 A1 | 1/2006 | Gull et al. |
| 2006/0126647 A1* | 6/2006 | Hicks, III ...................... 370/401 |
| 2008/0052027 A1* | 2/2008 | Witter et al. .................. 702/108 |
| 2008/0162930 A1* | 7/2008 | Finney et al. ................. 713/165 |

OTHER PUBLICATIONS

Jarkowski M et al; "New approach for management services with a Web browser" Computer Networks and ISDN Systems, North Holland Publishing. Amsterdam, NL, vol. 31, No. 21, Nov. 10, 1999, pp. 2227-2236, XP002185729; ISSN: 0169-7552; p. 2230, right-hand column, lines 7-12.

Chemmangot V Nayar et al: "A Grid-Interactive Photovoltaic Uninterrruptible Power Supply System Using Battery Storage and a Back Up Diesel Generator," IEEE Transactions on Energy Conversion, IEEE Service Center, Piscataway, NJ, US, vol. 15, No. 3, Sep. 1, 2000, XP011015573; ISSN: 0885-8969; sections "I. Introduction" and "II. System Description".

\* cited by examiner

_908_

My Generator
System Settings

Sidebar:
- STATUS & CONTROL
- GENERAL INFORMATION
- LOGIN
- SYSTEM SETTINGS
- NETWORK SETTINGS
- REMOTE ACCESS
- INSTALLER INFORMATION
- LOGOUT

Generator
| | |
|---|---|
| Model Number | 01815 |
| Rating | 12 kw |
| Serial Number | 1222123 |
| Fuel Type | LP |
| CMA Program Version | 1.00.1 |

Transfer Switch
| | |
|---|---|
| Model Number | 01918 |
| Rating | 100A |
| Serial Number | 2255325 |

Timer Settings

| | Hours | Email? |
|---|---|---|
| Oil Change | 50 | ☒ |
| Spark Plug | 100 | ☒ |
| Air Filter | 50 | ☒ |

System Exercise

| | Hours |
|---|---|
| Next System Exercise | 950 |
| Exercise Interval | 50 |
| Exercise Duration | .25 |
| Exercise Control | ON |

Submit

My Generator
Installation Information

Installation Date
- Month: April
- Date: 12
- Year: 2005

Installer Information
- Company: John's Small Engines, Inc
- Contact: John Smith
- Add #1: 900 North Parkway
- Add #2: Suite #550
- City: Somewhere
- State/Prov: WI
- Postal Code: 53111
- Office Phone: (555) 555-5555
- Cell Phone: (555) 555-5555
- Fax:
- Email: JohnsSmallEngine@23423.com Sidebar: STATUS & CONTROL | GENERAL INFORMATION | LOGIN | SYSTEM SETTINGS | NETWORK SETTINGS | REMOTE ACCESS | INSTALLER INFORMATION | LOGOUT

[Submit]

FIG. 10F

| PARAMETER | DESCRIPTION | DEFAULT | ACCESS PRIVILEGE | |
|---|---|---|---|---|
| | | | CUSTOMER | INSTALLER |
| *CONFIGURATION PARAMETERS* | | | | |
| MODEL # OF GENERATOR | MODEL NUMBER OF GENERATOR | 0 | R/O | R/W |
| SERIAL # OF GENERATOR | SERIAL NUMBER OF GENERATOR | 0 | R/O | R/W |
| MODEL # OF TRANSFER SWITCH | MODEL NUMBER OF TRANSFER SWITCH | 0 | R/O | R/W |
| SERIAL # OF TRANSFER SWITCH | SERIAL NUMBER OF TRANSFER SWITCH | 0 | R/O | R/W |
| TRANSFER SWITCH SOFTWARE REVISION | | 0 | R/O | R/W |
| DEVICE NAME | USER FRIENDLY NAME FOR THE DEVICE | NONE | R/W | R/W |
| INSTALLATION DATE | ONE FIELD FOR EACH OF GENERATOR, TRANSFER-SWITCH AND BIU. DEALER CAN ONLY SET EACH ONE ONCE ONCE ADMIN CAN CHANGE AT ANY TIME. | NONE | R/O | R/W |
| DEALER CONTACT INFORMATION | CONTACT INFO FOR DEALER WHERE SYSTEM WAS PURCHASED | NONE | R/O | R/W |
| ELECTRICAL INSTALL CONTACT INFORMATION | CONTACT INFO FOR COMPANY/PERSON THAT DID ELECTRICAL WORK | NONE | R/O | R/W |
| GAS SUPPLY INSTALL CONTACT INFORMATION | CONTACT INFO FOR COMPANY/PERSON THAT INSTALLED GAS FEED | NONE | R/O | R/W |
| CURRENT OWNER INFORMATION | CONTACT INFO FOR PERSON WHO CURRENTLY OWNS THE GENERATOR SYSTEM | NONE | R/W | R/W |
| CURRENT CONTACT INFORMATION | CONTACT INFO FOR PERSON WHO MANAGES THE GENERATOR SYTEM | NONE | R/W | R/O |
| *SYSTEM PARAMETERS* | | | | |
| AUTO UPGRADE | WHETHER OR NOT TO AUTOMATICALLY UPGRADE WHEN THERE IS NEW SYSTEM SOFTWARE | ENABLED | R/O | R/O |
| POLL INTERVAL | DEFAULT TIME IN SECONDS BETWEEN POLLING OPERATIONS | 300 | R/O | R/O |
| *NETWORK PARAMETERS* | | | | |
| CENTRAL MANAGEMENT SERVER ADDRESS | NAME OF CENTRAL MANAGEMENT SERVER | SERVER.BRIGGSAN DSTRATTON.COM | R/O | R/O |
| CENTRAL MANAGEMENT SERVER IP | IP ADDRESS OF DEFAULT SERVER IF DNS FAILS | TBD | R/O | R/O |
| IP ADDRESS METHOD | METHOD TO USE TO GET LOCAL IP ADDRESS (DHCP/STATIC) | DHCP | R/W | R/W |
| IP ADDRESS | CURRENT IP ADDRESS | 000.000.0.000 | R/W(MANUAL MODE) | R/W(MANUAL MODE) |
| SUBNET MASK | CURRENT SUBNET MASK | 000.000.000.000 | R/W(MANUAL MODE) | R/W(MANUAL MODE) |
| DEFAULT GATEWAY | CURRENT DEFAULT GATEWAY | 000.000.000.0 | R/W(MANUAL MODE) | R/W(MANUAL MODE) |
| DNS SERVER | IP ADDRESS OF THE DNS SERVER | 0.0.0.0 | R/W(MANUAL MODE) | R/W(MANUAL MODE) |

*FIG. 13*

| PARAMETER | TYPE | DESCRIPTION |
|---|---|---|
| UTILITY VOLTAGE PRESENT | STATUS | THE GS DETECTS UTILITY VOLTAGE IS PRESENT |
| GENERATOR VOLTAGE PRESENT | STATUS | THE GS IS GENERATING POWER |
| TRANSFER SWITCH BOX FUSE OPEN | STATUS | THE TRANSFER SWITCH FUSE HAS FAILED |
| UTILITY VOLTAGE JUST LOST | STATUS | THE UTILITY POWER HAS JUST BEEN DETECTED TO BE LOST |
| TRANSFER SWITCH STATE | STATUS | CURRENT STATE OF THE TRANSFER SWITCH (ENGAGED/NOT ENGAGED) |
| TRANSFER SWITCH GENERATOR-SIDE COIL FAIL | FAULT | GENERATOR-SIDE SOLENOID FAILURE |
| TRANSFER SWITCH UTILITY-SIDE COIL FAIL | FAULT | UTILITY-SIDE SOLENOID FAILURE |
| LOW BATTERY VOLTAGE | FAULT | THIS CONDITION OCCURS IF THE GENERATOR CANNOT START BECAUSE THE STARTING BATTERY OUTPUT POWER IS BELOW THAT NEEDED TO CRANK THE ENGINE. |
| LOW OIL PRESSURE | FAULT | THIS CONDITION OCCURS WHEN THE OIL PRESSURE DROPS BELOW A PRESET THRESHOLD |
| LOW VOLTAGE | FAULT | THIS CONDITION IS CAUSED BY A RESTRICTION IN THE FUEL FLOW, A BROKEN OR DISCONNECTED SIGNAL LEAD, A FAILED ALTERNATOR WINDING, THE CONTROL PANEL CIRCUIT BREAKER IS OPEN, OR HOME GENERATOR SYSTEM IS OVERLOADED. |
| ENGINE FAIL TO START | FAULT | ENGINE FAILED TO START |
| LOW FREQUENCY | FAULT | THIS CONDITION OCCURS WHEN THE OUTPUT FREQUENCY IS BELOW 55HZ FOR THREE SECONDS. |
| ENGINE OVERSPEED | FAULT | THIS CONDITION OCCURS WHEN THE OUTPUT FREQUENCY IS ABOVE 65-70HZ FOR THREE SECONDS. IF THE OUTPUT FREQUENCY IS ABOVE 70HZ, THE GENERATOR WILL SHUT DOWN IMMEDIATELY. |
| OIL TEMPERATURE HIGH | FAULT | THIS CONDITION WILL OCCUR WHEN THE OIL TEMPERATURE EXCEEDS 140°C. |
| TRANSFER SWITCH FAULT | FAULT | FAULT IN THE TRANSFER SWITCH |
| WATTAGE | COUNTER | CURRENT GENERATOR WATTAGE OUTPUT |
| TOTAL RUNTIME HOURS | COUNTER | CURRENT GENERATOR TOTAL RUNTIME |
| SPARK PLUG HOURS | COUNTER | CURRENT NUMBER OF HOURS OF SPARK PLUG OPERATION |
| AIR FILTER HOURS | COUNTER | CURRENT NUMBER OF HOURS OF AIR FILTER OPERATION |
| OIL FILTER HOURS | COUNTER | CURRENT NUMBER OF HOURS OF OIL FILTER OPERATION |
| HOURS UNTIL NEXT EXERCISE | COUNTER | CURRENT NUMBER OF HOURS UNTIL THE NEXT AUTOMATIC EXERCISE CYCLE |
| EXERCISE REMAIN MINUTES | COUNTER | MINUTES REMAINING IN CURRENT EXERCISE |

*FIG. 14*

| PARAMETER | UNITS | DESCRIPTION |
|---|---|---|
| TOTAL RUNTIME | HOURS | A RUNNING COUNT OF THE TOTAL MINUTES THAT THE GENERATOR HAS BEEN ACTIVE. |
| TOTAL TRANSFER SWITCH ENGAGEMENT TIME | HOURS | A RUNNING COUNT OF THE TOTAL MINUTES THAT THE TRANSFER SWITCH HAS BEEN IN THE ACTIVE POSITION. |
| SPARK PLUG RUNTIME | HOURS | HOURS OF SPARK PLUG OPERATION |
| AIR FILTER RUNTIME | HOURS | HOURS OF AIR FILTER OPERATION |
| OIL FILTER RUNTIME | HOURS | HOURS OF OIL FILTER OPERATION |
| TIME TILL EXERCISE | HOURS | NUMBER OF HOURS UNTIL NEXT EXERCISE |
| REMAINING EXERCISE TIME | MINUTES | NUMBER OF MINUTES REMAINING IN CURRENT AUTOMATIC EXERCISE |
| SWITCH ENGAGEMENT | NUMBER OF EVENTS | NUMBER OF SWITCH ENGAGEMENT EVENTS |
| LOW BATTERY VOLTAGE | NUMBER OF EVENTS | NUMBER OF LOW BATTERY VOLTAGE EVENTS |
| LOW OIL PRESSURE | NUMBER OF EVENTS | NUMBER OF LOW OIL PRESSURE EVENTS |
| LOW VOLTAGE | NUMBER OF EVENTS | NUMBER OF LOW VOLTAGE EVENTS |
| ENGINE FAIL TO START | NUMBER OF EVENTS | NUMBER OF TIMES THAT THE ENGINE HAS FAILED TO START |
| LOW FEQUENCY | NUMBER OF EVENTS | NUMBER OF LOW FREQUENCY EVENTS |
| ENGINE OVERSPEED | NUMBER OF EVENTS | NUMBER OF ENGINE OVERSPEED EVENTS |
| OIL TEMPERATURE HIGH | NUMBER OF EVENTS | NUMBER OF TIMES THE OIL TEMPERATURE HIGH CONDITION HAS OCCURRED |
| TRANSFER SWITCH FAULT | NUMBER OF EVENTS | NUMBER OF TIMES THE TRANSFER FAULT SWITCH HAS OCCURRED |
| TOTAL SHUTDOWNS | NUMBER OF EVENTS | TOTAL NUMBER OF TIMES THE GENERATOR HAS BEEN SHUTDOWN BY A FAULT CONDITION. |

*FIG. 15*

| PARAMETER | TYPE | DESCRIPTION |
|---|---|---|
| SYSTEM START | ALERT | THE BIU HAS BOOTED |
| FAILED TO RECEIVE GENERATOR STATUS | ALARM | THIS EVENT IS GENERATED WHEN GENERATOR STATUS HAS NOT BEEN RECEIVED WITHIN 10 MINUTES. |
| INVALID GENERATOR STATUS | ALARM | THIS EVENT IS GENERATED WHEN GENERATOR STATUS CONTAINS ERRORS |
| FAILURE TO CONNECT TO SERVER | ALARM | THIS EVENT IS GENERATED WHEN THE BIU HAS FAILED TO CONNECT TO THE CENTRAL MANAGEMENT SERVER 5 TIMES. |
| SPARK PLUG MAINTENANCE PERFORMED | ALERT | SPARK PLUG MAINTENANCE HAS BEEN PERFORMED ON THE GENERATOR |
| AIR FILTER MAINTENANCE PERFORMED | ALERT | AIR FILTER MAINTENANCE HAS BEEN PERFORMED ON THE GENERATOR |
| OIL FILTER MAINTENANCE PERFORMED | ALERT | OIL FILTER MAINTENANCE HAS BEEN PERFORMED ON THE GENERATOR |
| BIU CONFIGURATION CHANGED | ALERT | A CONFIGURABLE PARAMETER ON THE BIU HAS BEEN CHANGED EITHER LOCALLY OR REMOTELY. THE MESSAGE WILL CONTAIN THE CHANGED PARAMETER AND VALUE. |

*FIG. 16*

| CURRENT STATUS | | |
|---|---|---|
| DEVICE NAME | MY GENERATOR | MY GENERATOR |
| GENERATOR STATE | RUNNING/STANDBY/OFF | |
| TRANSFER SWITCH STATE | NOT ENGAGED/ENGAGED/FAILURE | |
| GENERATOR FAULT | FAULT CODE (SEE ERROR! REFERENCE SOURCE NOT FOUND.) | |
| LAST FAULT TIME | 4/06/06 | |
| OUTPUT WATTAGE | xxxxWATTS/NOT ACTIVE | |
| CMS CONNECTION STATUS | OK/FAILURE | |
| MAINTENANCE STATUS | | |
| TOTAL GENERATOR HOURS | 950 | |
| NEXT SYSTEM EXERCISE | 4/12/06, 8:00A.M. | |
| NEXT OIL CHANGE | 50 | RESET |
| NEXT SPARK PLUG CHANGE | NOW! | RESET |
| NEXT AIR FILTER CHANGE | 50 | RESET |
| NEXT SCHEDULED MAINTENANCE | 06/07/06 | 06/07/06 |

*FIG. 17*

| GENERATOR INFORMATION | |
|---|---|
| MODEL NUMBER OF GENERATOR | 040212 |
| GENERATOR FUEL TYPE | LP/NATURAL GAS |
| SERIAL NUMBER OF GENERATOR | 55-5555-555 |
| TRANSFER SWITCH MODEL NUMBER | 071013 |
| TRANSFER SWITCH SERIAL NUMBER | 68-9000-987 |
| INSTALLATION DATE | 3/04/06 |
| TRANSFER SWITCH SOFTWARE REVISION | 1.2 |

*FIG. 18*

| TIME INTERVAL SELECT | | |
|---|---|---|
| TIME INTERVAL | SINCE INSTALLATION | 1 DAY ▽<br>1 DAY<br>1 WEEK<br>1 MONTH<br>SINCE INSTALLATION |
| COUNTERS | | |
| TOTAL RUNTIME | 100 HOURS | RESET |
| TOTAL TRANSFER SWITCH ENGAGEMENT TIME | 70 HOURS | RESET |
| LOW BATTERY VOLTAGE | 10 | RESET |
| LOW OIL PRESSURE | 0 | RESET |
| LOW VOLTAGE | 0 | RESET |
| ENGINE FAIL TO START | 1 | RESET |
| LOW FREQUENCY | 0 | RESET |
| ENGINE OVER-SPEED | 1 | RESET |
| OIL TEMPERATURE HIGH | 1 | RESET |
| TRANSFER SWITCH FAULT | 0 | RESET |

*FIG. 19*

| VIEW FILTER AND SELECT | |
|---|---|
| DISPLAY PAGE | 1,2,3,4,5 |
| DISPLAY SORTING | MOST RECENT FIRST — MOST RECENT FIRST ▽ / OLDEST FIRST |
| DISPLAY FILTER | SOURCE: ALL ☐ GENERATOR ☐ SYSTEM ☐    TYPE: ALL ☐ GENERATOR FAULT ☐ SYSTEM START ☐ POWER FAILURE ☐ MAINT ☐ INFO ☐ |

EVENTS (PAGE 1)

| DATE | TIME | TYPE | DESCRIPTION |
|---|---|---|---|
| 1/30/06 | 12:00 | SYSTEM | SYSTEM START |
| 1/30/06 | 12:04 | GENERATOR | GENERATOR START |
| 1/30/06 | 12:05 | GENERATOR | TRANSFER SWITCH ENGAGE |
| 1/30/06 | 12:04 | GENERATOR | TRANSFER SWITCH DISENGAGE |
| 1/30/06 | 12:05 | GENERATOR | GENERATOR SHUTDOWN |
| 2/12/06 | 2:00 | SYSTEM | SYSTEM START |
| 2/12/06 | 2:04 | GENERATOR | GENERATOR START |
| 2/12/06 | 2:05 | GENERATOR | TRANSFER SWITCH ENGAGE |
| 2/14/06 | 2:10 | FAULT | LOW OIL PRESSURE |
| 2/23/06 | 2:10 | FAULT | TRANSFER SWITCH DISENGAGE |

FIG. 20

| NETWORK PARAMETERS | | |
|---|---|---|
| CENTRAL MANAGEMENT SERVER | | |
| CMS CONNECT STATUS | OK/FAILURE | |
| CMS ADDRESS | SERV1.BANDS.COM | |
| CMS IP | 00.00.00.00 | |
| TEST CMS CONNECTION | | TEST SERVER |
| LOCAL NETWORK | | |
| IP ADDRESS METHOD | DHCP | DHCP ▽ / DHCP / STATIC |
| IP ADDRESS | 111.111.111.11 | 111.111.111.11 |
| SUBNET MASK | 111.111.111.11 | 111.111.111.11 |
| DEFAULT GATEWAY | 111.111.111.11 | 111.111.111.11 |
| DNS SERVER | 111.111.111.11 | 111.111.111.11 |

*FIG. 21*

| INSTALLER CONTACT INFO | |
|---|---|
| NAME | JOHN SMITH |
| ADDRESS #1 | P.O. BOX 702 |
| ADDRESS #2 | |
| CITY | SOMEWHERE |
| STATE / PROVINCE | WI |
| POSTAL CODE | 53210 |
| PHONE | (555) 555-5555 |
| EMAIL | SUPPORT@EMAIL.COM |

*FIG. 22*

| OWNER CONTACT INFO | |
|---|---|
| NAME | JOE HOMEOWNER |
| ADDRESS #1 | P.O. BOX 702 |
| ADDRESS #2 | |
| CITY | SOMEWHERE |
| STATE / PROVINCE | WI |
| POSTAL CODE | 53210 |
| PHONE | (555) 555-5555 |
| EMAIL | OWNER@HOME.COM |

*FIG. 23*

POWER MONITORING SYSTEM

RELATED APPLICATION DATA

This application is the National Stage of International application No. PCT/US2008/076638, filed Sep. 17, 2008; which claims the benefit of U.S. Provisional Application No. 61/027553, filed Feb. 11, 2008, U.S. Provisional application No. 61/022862, filed Jan. 23, 2008, and U.S. Provisional Application No. 60/973623, filed Sep. 19, 2007 which are all fully incorporated herein by reference.

BACKGROUND

The invention relates to power distribution, and more particularly, to standby generators.

During a power outage in a residence, if a secondary power source or a back up power source such as a standby generator has been installed, the secondary power source will normally be turned on either manually or automatically to provide power to the residence. Operating status such as oil levels of the back up power source are typically only accessible at the residence. Furthermore, settings such as installation requirements, maintenance frequency, outage frequency and amount, and types of failure of the back up power source are usually only available to the user or a maintenance person at the generator location.

SUMMARY

In one embodiment, the invention provides a hierarchically accessible monitoring system configured to be used with a standby generator. The hierarchically accessible monitoring system includes an interface unit configured to receive information from the standby generator and to communicate the generator information, and a remote data server in communication with the interface unit. The remote data server receives the generator information from the interface unit, stores the generator information, and controls access to the generator information based upon at least two hierarchical levels, each hierarchical level having different access privileges. The hierarchically accessible monitoring system also includes a user interface configured to display the generator information from the remote data server to at least one user. The user has access privileges to read the generator information based upon the user's assigned hierarchical level.

In another embodiment, the invention provides a method of remotely accessing generator information from a standby generator. The method includes providing an interface unit that is in communication with the generator, the generator being at a first location, transmitting information about the generator through the interface unit to a remote data center at a second location, and transmitting the generator information from the remote data center via a user interface to a user.

In another embodiment, the invention provides a method of remotely accessing generator information from a standby generator. The method includes providing an interface unit that is in communication with the generator, transmitting generator information through the interface unit to a remote data center, controlling access to the generator information based upon at least two protected hierarchical levels, and transmitting the generator information from the remote data center via a user interface to a user having access privileges based upon the hierarchical level associated with the user.

Other aspects of the invention will become apparent by consideration of the detailed description and accompanying drawings.

BRIEF DESCRIPTION OF THE DRAWINGS

FIG. 10C is a screen display of information of the system of any one of FIGS. 1-5 depicting the System Setting of the generator system.

FIG. 10F is a screen display of information of the system of any one of FIGS. 1-5 depicting the Installation Information of the system.

FIG. 13 is an exemplary table of parameters stored by the BIU and server for a selected customer system.

FIG. 14 is a table of status information definitions of a generator monitored by the present invention.

FIG. 15 is a table of typical BIU status counter events according to the present invention.

FIG. 16 is a table of typical BIU events according to the present invention.

FIG. 17 depicts exemplary status information of a generator being monitored according to the present invention.

FIG. 18 depicts exemplary generator system information displayed on a web page for a generator being monitored using the present invention.

FIG. 19 depicts exemplary counters displayed on a web page for a generator being monitored using the present invention.

FIG. 20 depicts an exemplary event logging information web page for a generator being monitored using the present invention.

FIG. 21 depicts an exemplary network configuration for a system according to the present invention.

FIG. 22 depicts exemplary contact information of a dealer displayed on a web page.

FIG. 23 depicts exemplary customer contact information displayed on a web page.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As should also be apparent to one of ordinary skill in the art, the systems shown in the figures are models of what actual systems might be like. As noted, many of the modules and logical structures described are capable of being implemented in software executed by a microprocessor or a similar device or of being implemented in hardware using a variety of components including, for example, application specific integrated circuits ("ASICs"). Terms like "controller" may include or refer to both hardware and/or software. Furthermore, throughout the specification capitalized terms are used. Such terms are used to conform to common practices and to help correlate the description with the coding examples, equations and/or drawings. However, no specific meaning is implied or should be inferred simply due to the use of capitalization. Thus, the claims should not be limited to the specific examples or terminology or to any specific hardware or software implementation or combination of software or hardware.

Figure 1:
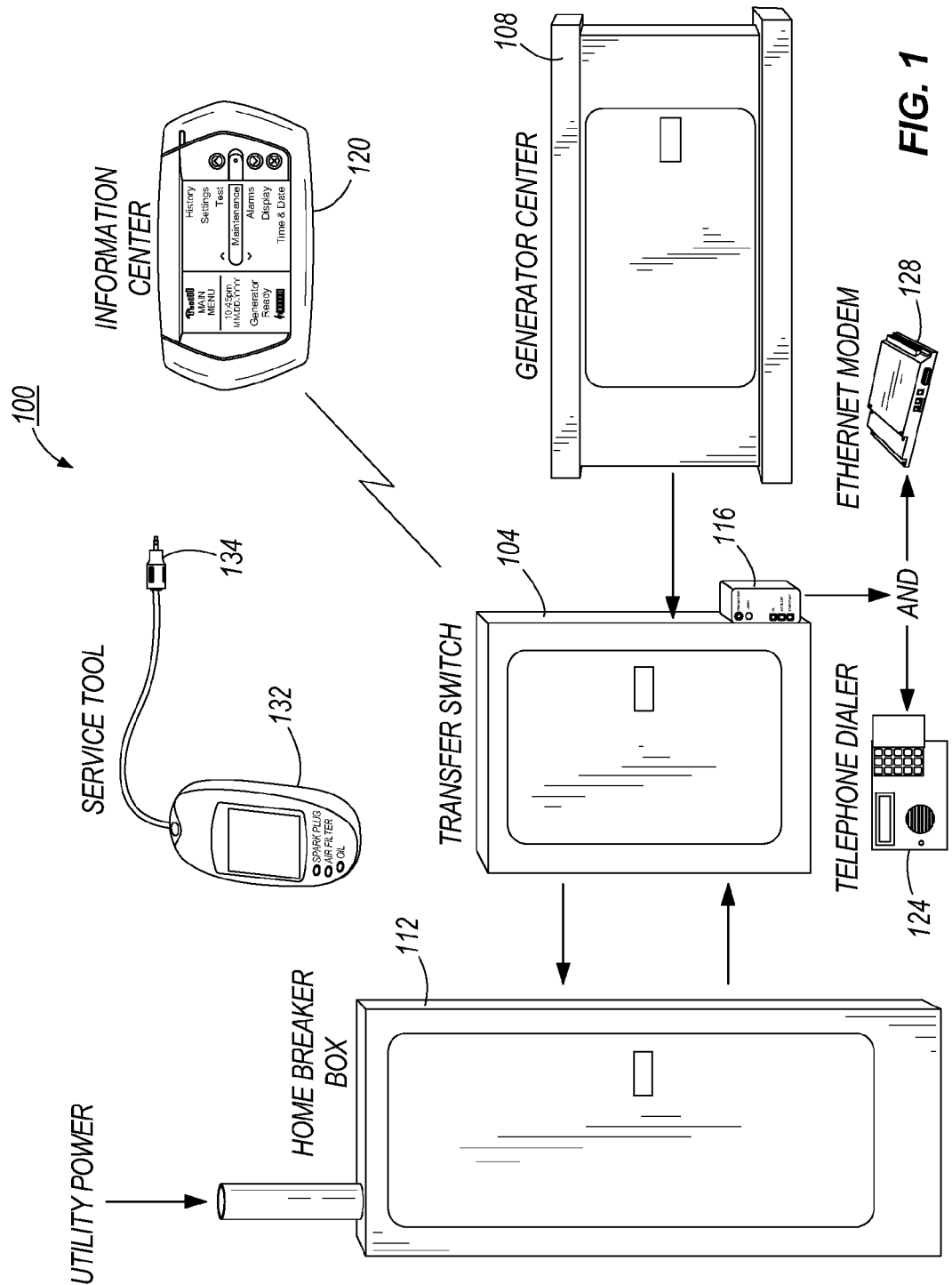
FIG. 1 is a first functional diagram of a remote monitoring system for use with a standby generator.

FIG. 1 is a functional diagram of a first remote monitoring system 100 for use with a standby generator. Particularly, the first system 100 includes a transfer switch 104 that is in communication with a generator center 108 and with a home breaker box 112 via electrical conduits. The generator center 108 includes a standby generator. The system 100 also includes a transfer switch communication module 116 that communicates with other components of the system 100 either through wired connections or wirelessly. In some embodiments, the communication module 116 may communicate wirelessly or via wired connections with an information center 120. The communication module 116 is also in communication with a telephone dialer 124 and an internet modem 128. A service tool 132 may also be in communication with the communication module 116, in a manner as discussed below.

Figure 2:
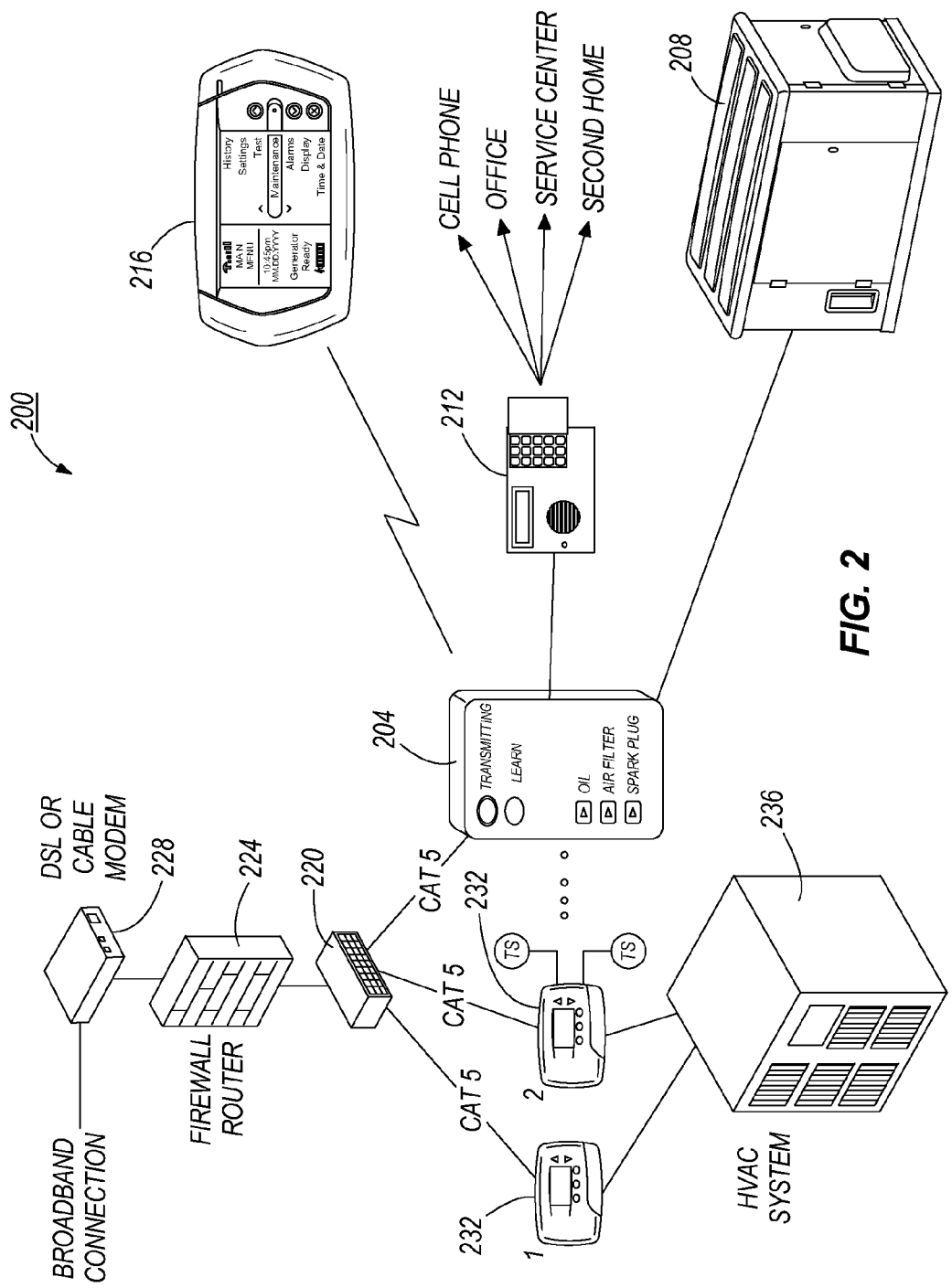
FIG. 2 is an exemplary wiring diagram of the system of FIG. 1.
Figure 7:
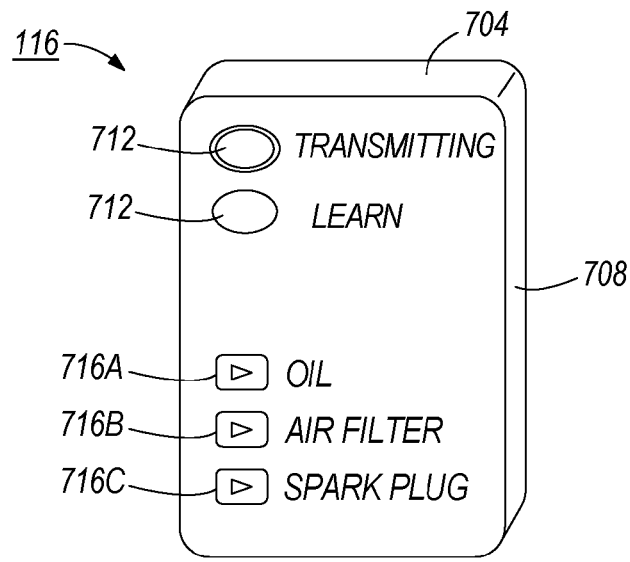
FIG. 7 is a communication module of the system of any one of FIGS. 1-5.

A suitable wiring connection of the system of FIG. 1 is depicted in FIG. 2. The RF transmitter 444 uses a 2-wire connection 460 to communicate with the generator control board 432 (FIG. 5) to communication with the generator 108. The RF transmitter 444 will send a signal to the generator controller 432 to communicate serially instead of using LED's 712 (FIG. 7). The RF transmitter 444 communicates via a 4-wire connection 472 from the ACCM 468 (air conditioner control module, which is subject of the U.S. patent application Ser. No. 11/180,228 filed Jul. 13, 2005, incorporated by reference herein) using a RS-232 connector. Further, the RF transmitter 444 has a 2-wire Not Operating (N.O.) contact 474 with the auto dialer 448. The N.O. contact 474 will open on a fault from the generator 108 or transfer switch 104. If no faults occur, the contact is closed. The RF transmitter 444 has a serial output for connection to a remote modem 128, e.g., an Ethernet or serial modem. The modem 128 communicates and transmits the status of the generator 108 and transfer switch 104. If the unit was running, it also transmits the output wattage of the generator. Although this is a wiring diagram for the system of FIG. 1, it may also be used with the system of FIG. 2 and FIG. 3.

The telephone dialer module 448 (FIG. 2) generally includes a normally closed contact that is wired to the telephone dialer 124 of FIG. 1. The normally closed contact is opened on any fault from either the generator 108 or from the transfer switch 104. If no fault is detected, the normally closed contact is energized in a known manner. In some other embodiments, the telephone dialer module 448 (FIG. 2) may include normally opened contacts that are energized when faults are detected in a known manner. Furthermore, the Ethernet embedded module 452 has a serial or a parallel output for communication with the modem 128. The modem 128 in turn communicates and transmits the operating status of the generator 108 and the transfer switch 104. If the modem 128 is operating properly, the modem 128 may also be configured to transmit the power usage of the system 100. Although these are shown as separate units, it may be preferable to include the modem 128, the Ethernet embedded module 452, and the telephone dialer module 448 in a single unit.

Figure 3:
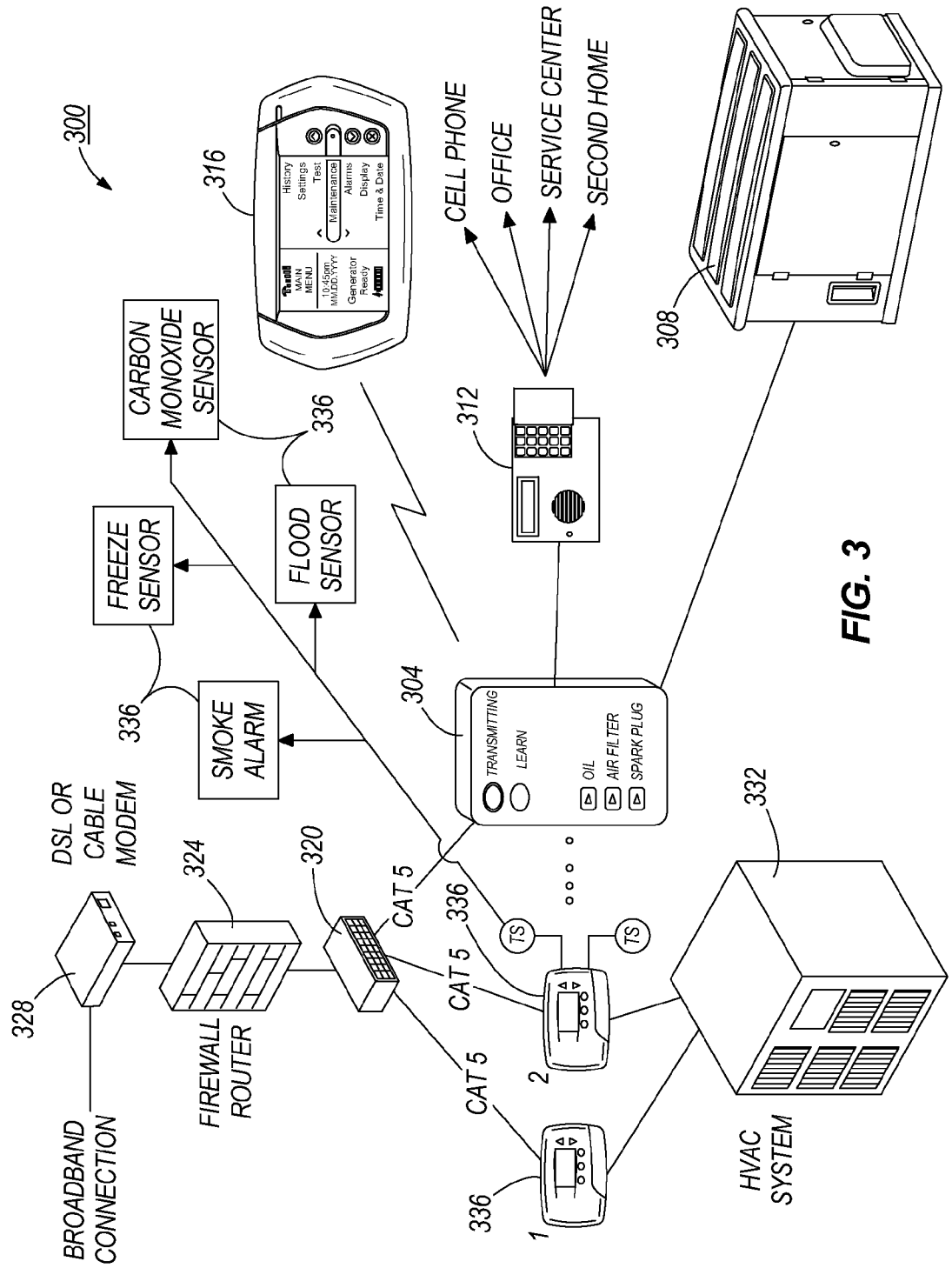
FIG. 3 is a second functional diagram of a remote monitoring system for use with a standby generator.

FIG. 3 is a functional diagram of a second remote monitoring system 200 according to the present invention, for use with a generator. Particularly, the second system 200 also includes a communication center 204 that is in communication with a generator 208, and a telephone dialer 212. In some embodiments, the communication center 204 is in communication with the generator 208 via a transfer switch (see FIGS. 1, 2, and 4 for example). The communication center 204 communicates with a remote information center 216 wirelessly or via a wired connection. FIG. 3 also shows that the communication center 204 in communication with an interface 220 that is in communication with user interface via a firewall router 224 and the modem 228. Particularly, the modem 228 provides a high speed or broadband connection to a publicly-accessible network such as the internet to a private network, or directly to another device via a private phone line.

In some embodiments, the modem may be a cable modem, or a digital subscriber line (DSL) modem. The interface 220 is in communication with one or more thermostats 232. As shown in FIG. 3, the thermostats 232 are in communication with a heating, ventilation, and air conditioning ("HVAC") system 236 in a known manner. In the embodiments shown in FIG. 3, the telephone dialer 212 may be configured to communicate with other systems such as a cell phone, an office telephone, a service center, facsimile, and a second home telephone. The operation of a system 200 is discussed below.

Figure 4:
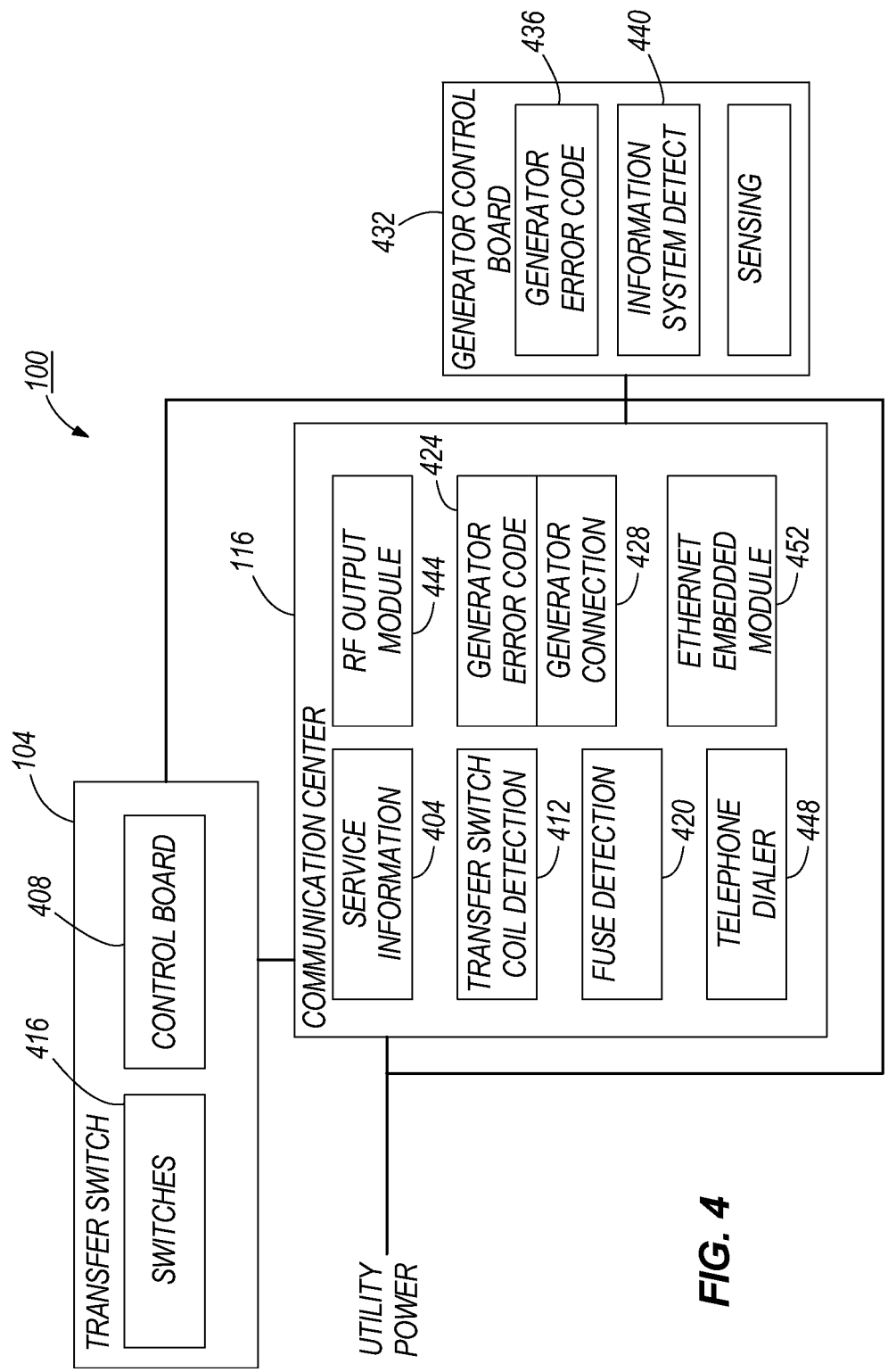
FIG. 4 is a third functional diagram of a remote monitoring system for use with a standby generator.

FIG. 4 is a third functional diagram of a remote monitoring system 300 according to the present invention for use with a standby generator. The monitoring system 300 is similar to the second system 200 as shown in FIG. 3. The system 300 also includes a communication module 304 that is in communication with a generator center 308, and a telephone dialer 312. The communication center 304 also wirelessly communicates with an information center 316. Like the system 200, the communication center 304 is also in communication with an interface 320 that may be in communication with a user interface via a firewall router 324 and a modem 328. FIG. 4 also shows that an HVAC system 332 is in communication with a plurality of thermostats 336. In some embodiments, the thermostats are in communication with a plurality of sensors such as temperature sensors. The thermostats 336 may also be in communication with appliances sensors such as a smoke alarm, freeze sensor, flood sensor, and carbon monoxide sensor. As in system 200, the dialer 312 may also be configured to communicate with systems such as a cell phone, office telephone, service center telephone, facsimile machine, and a second home phone.

Figure 5:
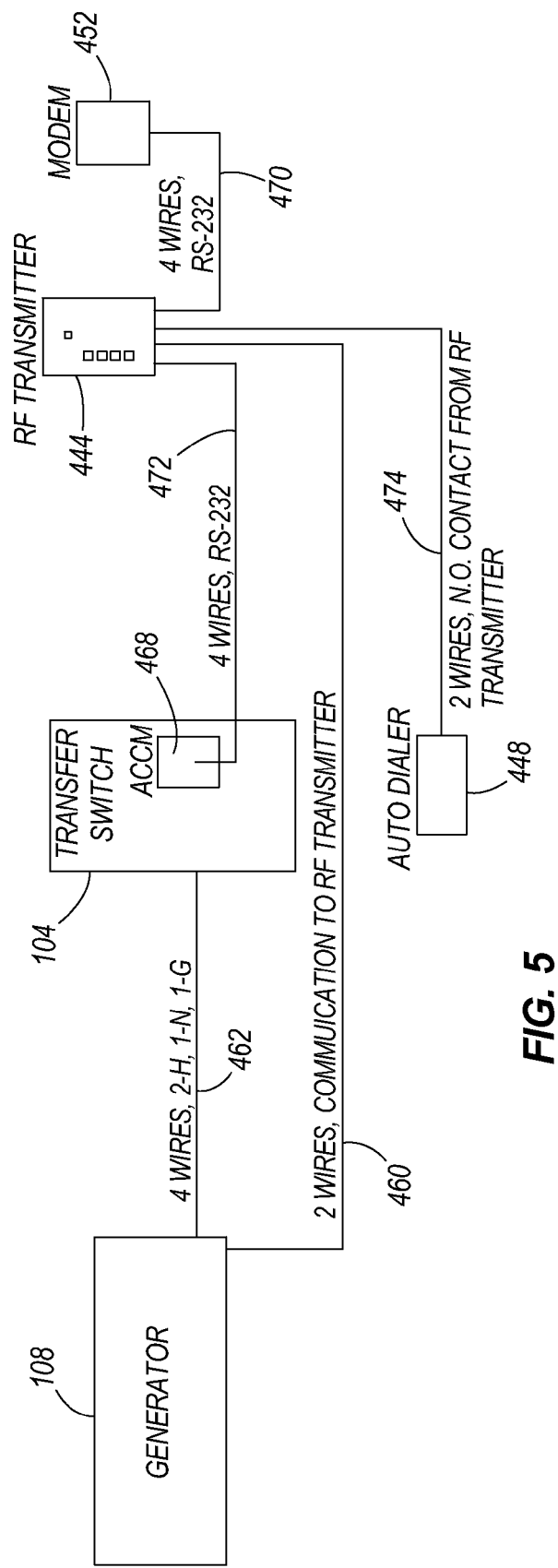
FIG. 5 is an exemplary functional block diagram of the system of any on of FIGS. 1-5.

FIG. 5 is an exemplary functional block diagram of the system 300 of FIG. 3. Although FIG. 5 is the functional block diagram of system 300, the functional block diagram may also be applied to the first and second systems 100 and 200. The communication module 116 includes a service information module 404 that is in communication with a transfer switch control board 408 of the transfer switch 104. Although the transfer switch control board 408 communicates with the service information module 404 via a serial connection, the transfer switch control board 408 may also be configured to communicate with the service information module 404 in other manners. The communication module 116 also includes a transfer switch coil detection module 412 that detects if switches 416 of the transfer switch box 104 are in an open state or in a closed state. The communication module 116 also includes a fuse detection module 420 that detects whether the fuses in the transfer switch are intact. The communication module 116 also includes a generator error detection module 424 and a generator interface 428 that is in communication with a generator control board 432 of the generator 108. The generator control board 432 includes a generator error code module 436, a generator information detection module 440 that senses and detects the operation status of the generator 108, and a sensing module 458 which accepts inputs from sensors in FIG. 4. Sensors include, but are not limited to a temperature sensor, a smoke alarm, a freeze sensor, a flood sensor or a carbon monoxide sensor. The generator information detection module 440, upon detection of any generator error, sends a signal to the generator error detection module 424 of the communication module 116 via the interface 428. The status of the generator or the error of the generator 108 is then transmitted out of the communication center 116 via a radio frequency ("RF") output module 444. The RF output module 444, or RF transmitter, may then wirelessly transmit the information regarding the generator 108 to the information center 120, or to the service tool connected to the communication center 116 or to the remote server. The communication center 116 also includes a telephone dialer module 448 and an Ethernet embedded module 452. The operations of the telephone dialer module 448 and the Ethernet embedded module 452 are discussed below.

The RF operating or output module 444 generally communicates at a predetermined frequency, for example, 400 MHz to comply with requirements from the Federal Communication Commission ("FCC"). However, in some embodiments, other frequencies, for example, 900 MHz, may be used.

To communicate with the generator control board 432, the communication center 116 preferably uses a two-wire connection. In some embodiments, the generator controller 432 communicates with the communication center 116 serially instead by using signals from the LED's 712 (FIG. 7). The communication center 116 may also include a four-wire connection to communicate with other generator controllers.

Figure 6:
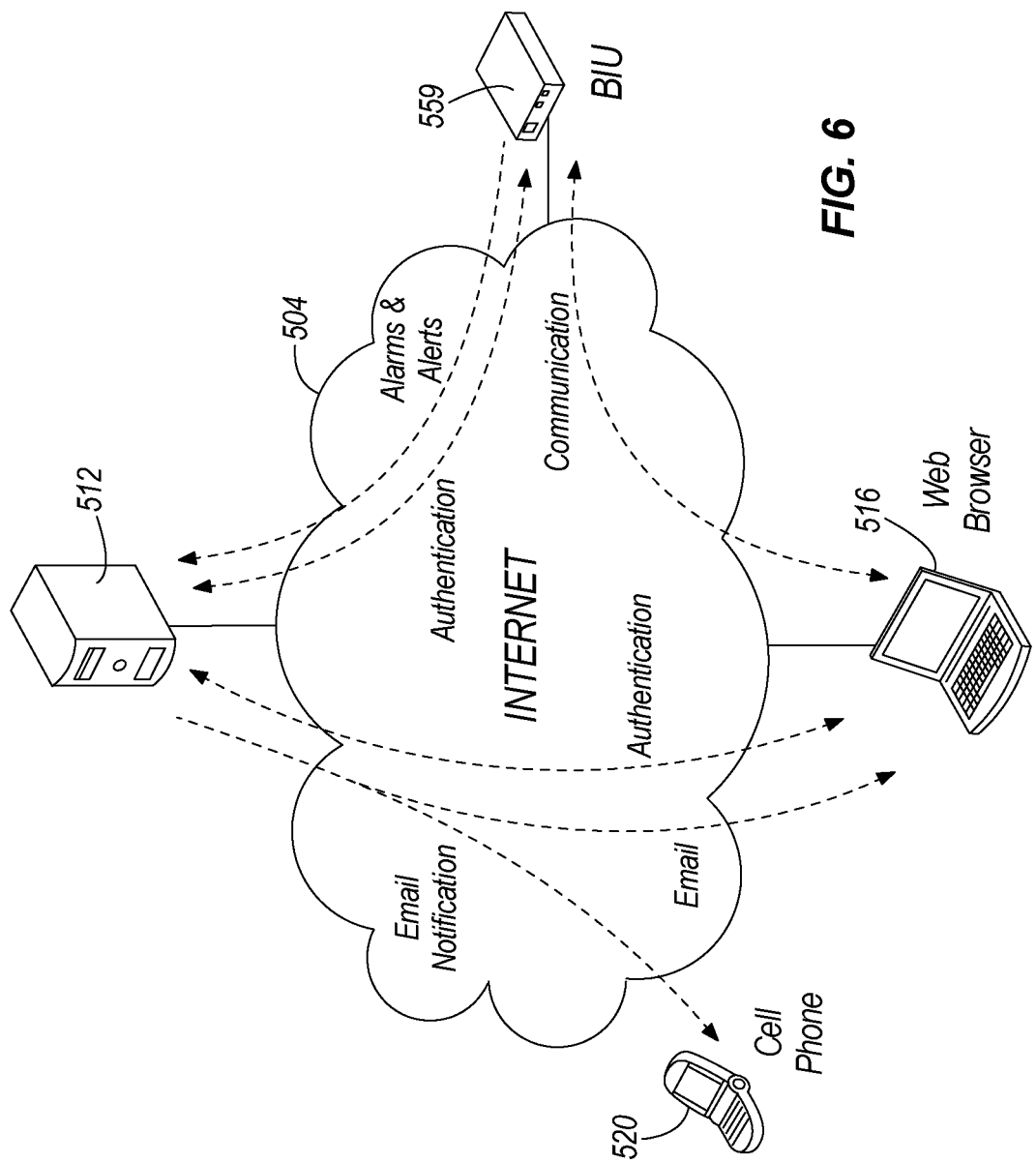
FIG. 6 is a communication flow diagram of the system of any one of FIGS. 1-5.
Figure 11:
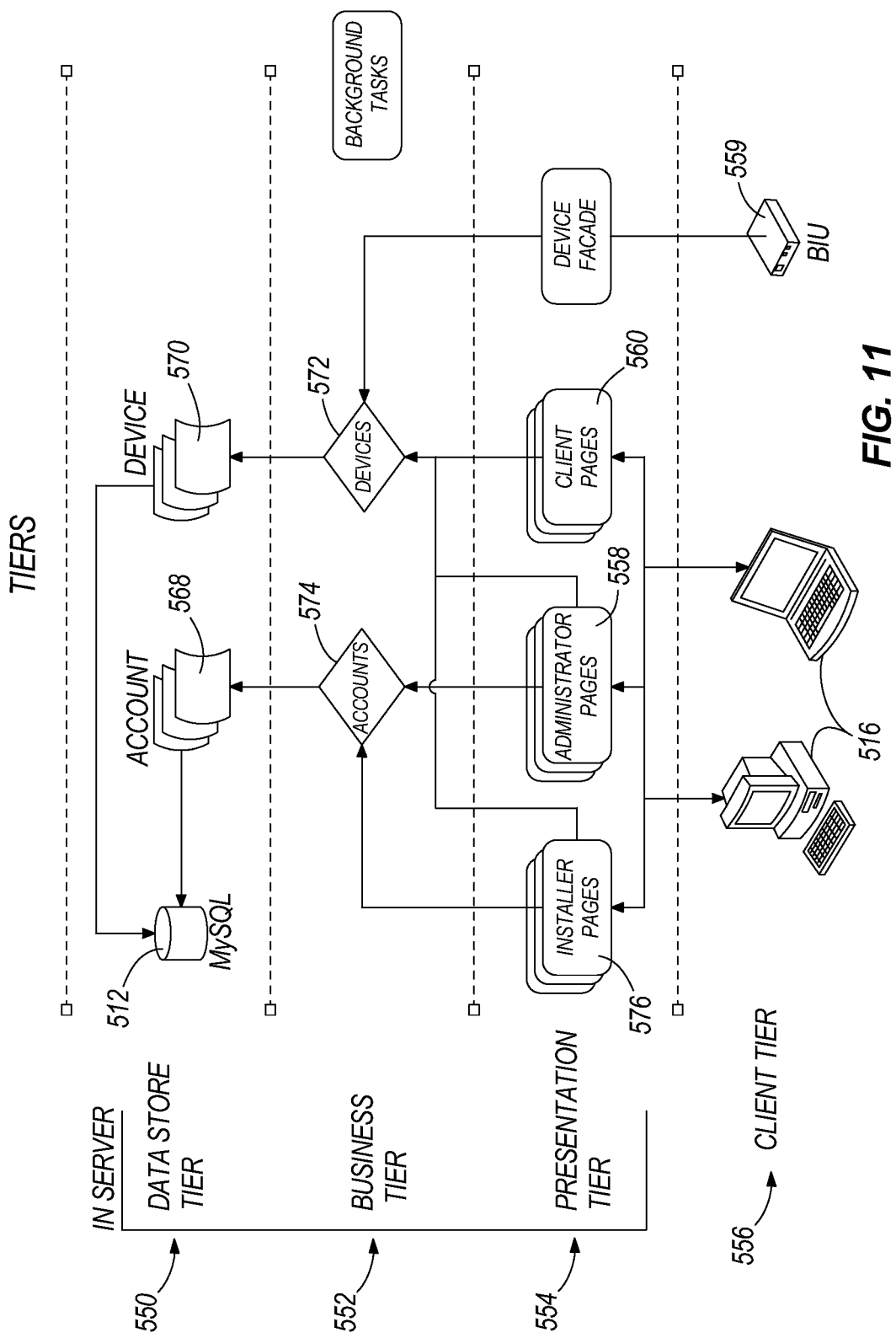
FIG. 11 is a diagram of the central monitoring system architecture.
Figure 24:
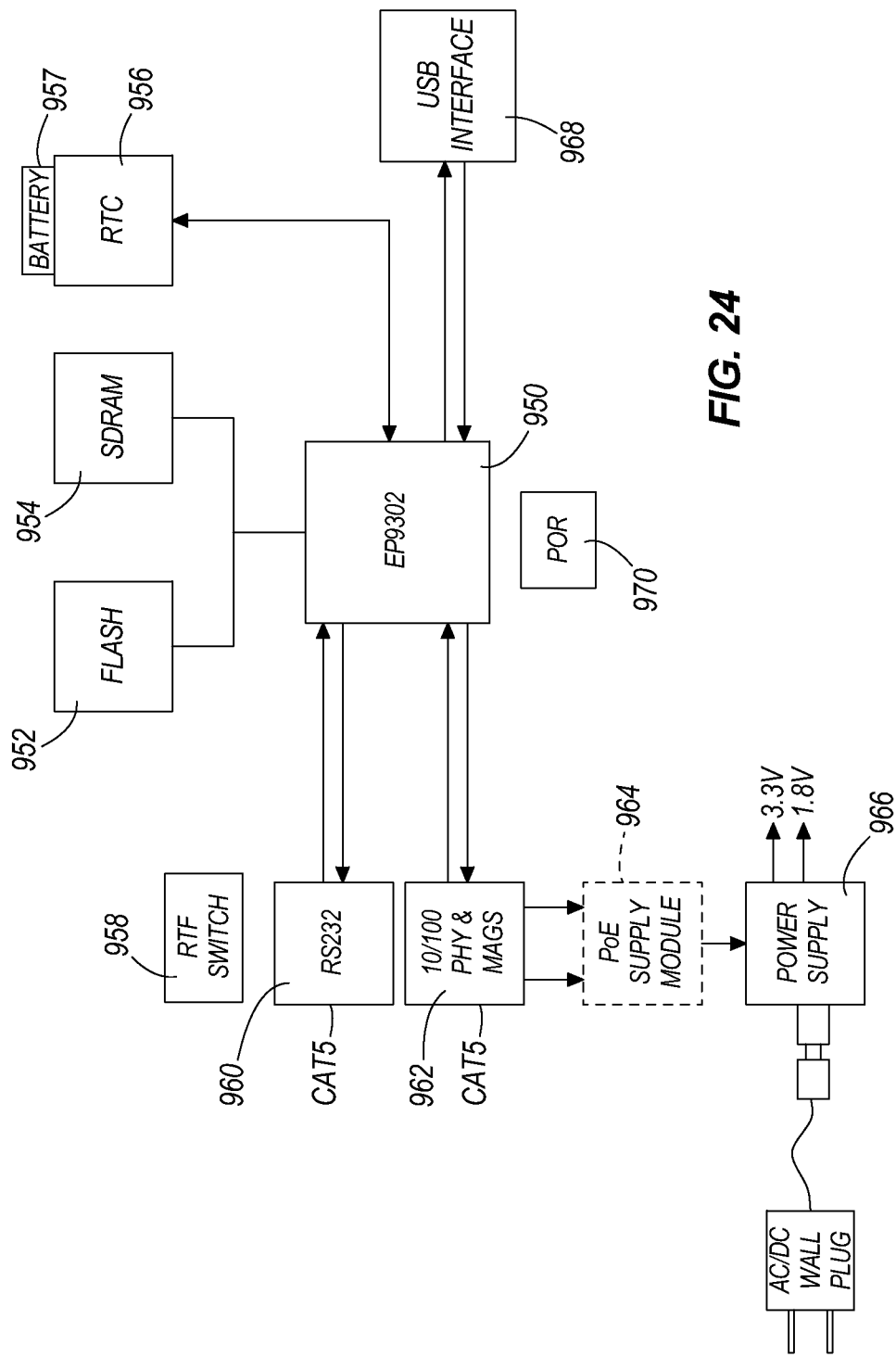
FIG. 24 depicts the hardware of the broadband interface unit (BIU).

In a preferred embodiment, the communication center that is in communication with the generator 108 and in communication with the data server 512 is an interface unit 559, preferably a broadband interface unit (BUI) 559 as depicted in FIG. 6 and FIG. 11. As depicted in FIG. 24, the BUI 559 includes memory 952 and 954, real time clock 956, power options 964 or 966, and physical interfaces 960 and 962. The memory includes at least a 16 KB external SRAM 954, and at least a 256 KB external non-volatile FLASH memory 952. The power options may be a 12 VDC wall mounted regulated power supply 966 or a Power over the Ethernet (PoE) supply 964. Physical interfaces include the modem 960 having a RS232 connector with support for the model control systems CTS (clear to send), RTS (request to send), DCD (data carrier detect) and DTR (data terminal ready), and the Ethernet which has a 10/100 network interface card with a RJ45 connector and using an 801.1b-801.1n WiFi protocol.

The BIU software is preferably firmware. The software provides the following functions: intercommunication to/from the RF transmitter, integral web server and remote access client interface, remote home standby software/firmware updates, and universal plug n and play (uPnP) connectability, e.g., using Rendezvous. The intercommunication to/from the RF transmitter 444 includes a BIU control including the network configuration and the payload encapsulation including home standby control and monitoring information. The integral web server provides local access by a TCP (Transmission Control Protocol) internet protocol, the browser-based authentication, hypertext markup language (HTML) status pages for the client, HTML status/control pages that are password protected and only changeable by dealer or installer, and the DHCP (Dynamic Host Configuration Protocol) IP addressing method. The remote access client interface includes hypertext transfer protocol (HTTP) software, Application Programmer's Interfaces (API's) including the server software interaction and dynamic self-discovery, including periodic heartbeat, device type identifier, alarms reporting and statistics gathering.

The server software, comprised of modules 806 (see FIG. 12), resides on the server 512 (see FIG. 11); the server 512 is provided by the manufacturer or a reputable third party hosting site. The server software performs the following functions: browser support, remote access server, home standby database manager, and hierarchical remote access privileges. The browser support includes Internet Explorer for PC (version 6.0 or greater), Sapphire for Mac (version 1.2.4 or greater), Firefox/Mozilla for PC or Mac (version 1.0 or greater) and portable data assistant (PDA) browsers. Hierarchical remote access privileges include three levels. Level 1 is the administrator level, which includes database queries, firmware downloads, communication to dealers and installers and administration of current and new dealers; Level 2 is the installer or dealer level, which includes administration of current and new clients, reception of alarm and alert notifications and control and monitoring of clients' home standby units. Level 3 is the customers' access level, where customers or clients may access generator information and status relating to their own standby unit.

The software is available to installers and will run on their portable devices (e.g. laptops) to assist in locating the BIU. The utility employs advanced network techniques (broadcast device request) to all local network nodes in an attempt to locate all devices and to establish connectivity for configuration and initial management. It provides downloadable Java applications and device discovery including device discovery broadcast and network status notification.

The system hardware contains an embedded web server which serves HTML pages to a web browser on a local network. Customers and installers will interact with the pages served by the system via the internal firmware. Interaction with these pages is preferably through a common web browser. A browser based login authentication method will be employed before either a customer, installer or dealer is able to access any of the pages.

FIG. 6 is a networked system functional diagram that shows exemplary system functions 500 of the system of FIG. 3. Although it is shown for system 300, it may also be applied to the first and second systems 100 and 200. As described earlier, the BIU 559 is in communication with a network such as a publicly-accessible network like the internet or a privately-accessible network 504. Particularly, the BUI unit 559 is connected to a data server 512 via the network 504. In some embodiments, the BIU unit 559 also communicates with an internet or web browser software program that is implemented on an output device 516, such as a laptop or computer, or a cell phone 520, PDA, printer or facsimile machine through the network 504. That is, an output device, such as a laptop or computer 516 may be connected to the systems 100, 200 and 300 via the network 504 and the BIU 559. In this way, a user may determine the status of operations in the systems 100, 200 and 300. In some embodiments, after the data server 512 has authenticated the accessing output device, e.g. laptop or computer 516 or cell phone 520, the browser or client program may communicate with the BUI 559 or the systems 100, 200, 300. The data server 512 may also send and receive e-mail from within the web browser of the output device 516. The data server 512 is also configured to notify the user through e-mail, text messages or phone message to a cell phone or PDA 520 that may be in communication with the network 506. FIG. 6 also shows a cell phone or PDA 520 that is wirelessly connected to the data server 512 via the internet to receive e-mail or text messages as notifications regarding the operation of the system through the data server 512. In some embodiments, the data server may send notifications via a facsimile machine or printer.

FIG. 7 is a top view of a communication center 116 used in the systems of FIGS. 1-5. The communication center 116 is generally housed in a weather-tight enclosure 704. In some embodiments, the communication center 116 also includes a flip-up cover 708. The communication center 116 also includes a plurality of light-emitting diodes ("LED") 712 that display a plurality of operations status of the generator and the communication center 116. The communication center 116 also includes a plurality of push buttons or switches 716A, 716B and 716C. The communication center 116 is also configured to be capable of withstanding a wide range of ambient temperatures, for example, between −20 degrees and 130 degrees Fahrenheit.

Particularly, the push buttons or switches 716A-716C may be used to transmit information of the generator 108 when activated. For example, a first button 716A may be used to clear or reset a "change oil" reminder that is set at the generator 108 or the generator control board 432. A second button 716B is configured to clear or reset a "change air filter" reminder that is set at the generator 108 or the generator control board 432. A third button 716C is configured to clear or reset a "change spark plug" reminder that is also set at the generator 108 or the generator control board 432. When any of the first, second, and third buttons is pressed or activated for a period of time, for example, three seconds, the communication center 116 will send a CLEAR signal to the generator controller 432 to clear a respective reminder, and to reset a respective counter to zero. In some other embodiments, the communication center 116 may also include a fourth button, a "CLEAR display button" (not shown) to synchronize a display of the information center 120.

Furthermore, as indicated earlier, the LED's 712 are used to indicate whether the communication is synchronized and whether a maintenance reminder has been cleared. The LED 712 stays ON for a period of time, for example five minutes, after the synchronization button has been pressed on the communication center 116. When a maintenance reminder button is pressed for a period of time, for example three seconds, the LED 712 flashes once to let an operator know that the communication center 116 had sent the CLEAR signal to the generator controller 432.

In some embodiments, the BUI 559 sends the status of the generator 108 and the transfer switch 104 to the information center 120 and/or the data server 512 periodically. In such cases, the period between each transmission may be programmed and be dependent on requirements. For example, when the generator 108 is running, the communication center 116 sends updates to the remote information center 120 every time information is sent from the ACCM controller 468 (FIG. 5) or generator controller 432, e.g., if there is a generator power change, e.g., a change of 500 Watts or more, or if there is a fault or a maintenance reminder.

Figure 8:
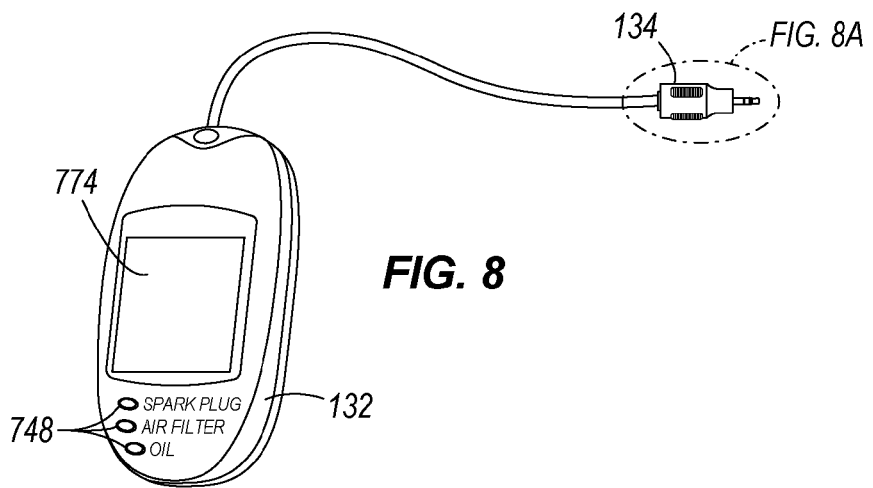
FIG. 8 is a service tool for the system of any one of FIGS. 1-5.
Figure 8A:
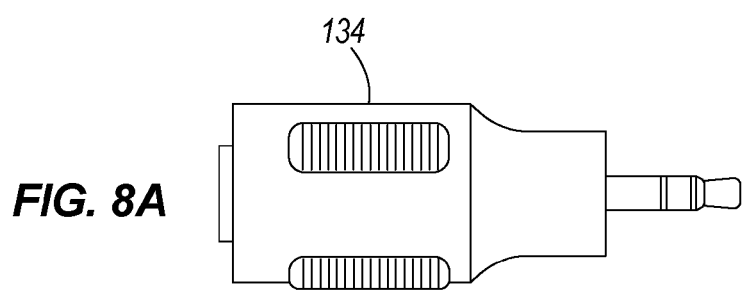
FIG. 8A is a detailed view of the plug of FIG. 8.

FIG. 8 is an exemplary service tool 132 that may be used with any of the systems of the present invention. The service tool 132 is configured to display information with text and graphics on a monitor or a screen 744. The service tool 132 may be connected to the communication center 116 or the generator center 108 via a plug 134. The plug 134 is shown in greater detail in FIG. 8A. In this way, the service tool 132 may be plugged or inserted into a receptacle located on the communication center 116 or the generator center 108 to retrieve information from the communication center 116 and the generator center 108, respectively. In some embodiments, the status of oil, air filter, and spark plug information from the generator control board 432 (FIG. 5) may be displayed in the monitor 774. The service tool 132 includes a plurality of buttons 748 that are similar to those on the communication center 116. In some embodiments, the service tool 132 may also include diagnostic functions that examine the status of the generator center 108 and the transfer switch 104. In some embodiments, a user of the service tool 132 may select the type of diagnostic functions that the service tool 132 may provide. Although the plug 134 is shown having the form of a stereo jack, other types of plugs such as a Category 5 cable jack, and a telephone plug may also be used. In some other embodiments, the service tool 132 includes a retractable plug (not shown) that may be inserted or plugged into the communication center 116 or the generator center 108 to directly access the information of the generator center 108. Furthermore, the service tool 132 may be configured to receive the information from the communication center 116 or the generator center 108 wirelessly via the RF communication module 444 (FIG. 5), in some embodiments. Still furthermore, the service tool 132 may include any other buttons that are used to select other information of the generator center 108. In some embodiments, status button cycles between codes and history display.

Figure 9:
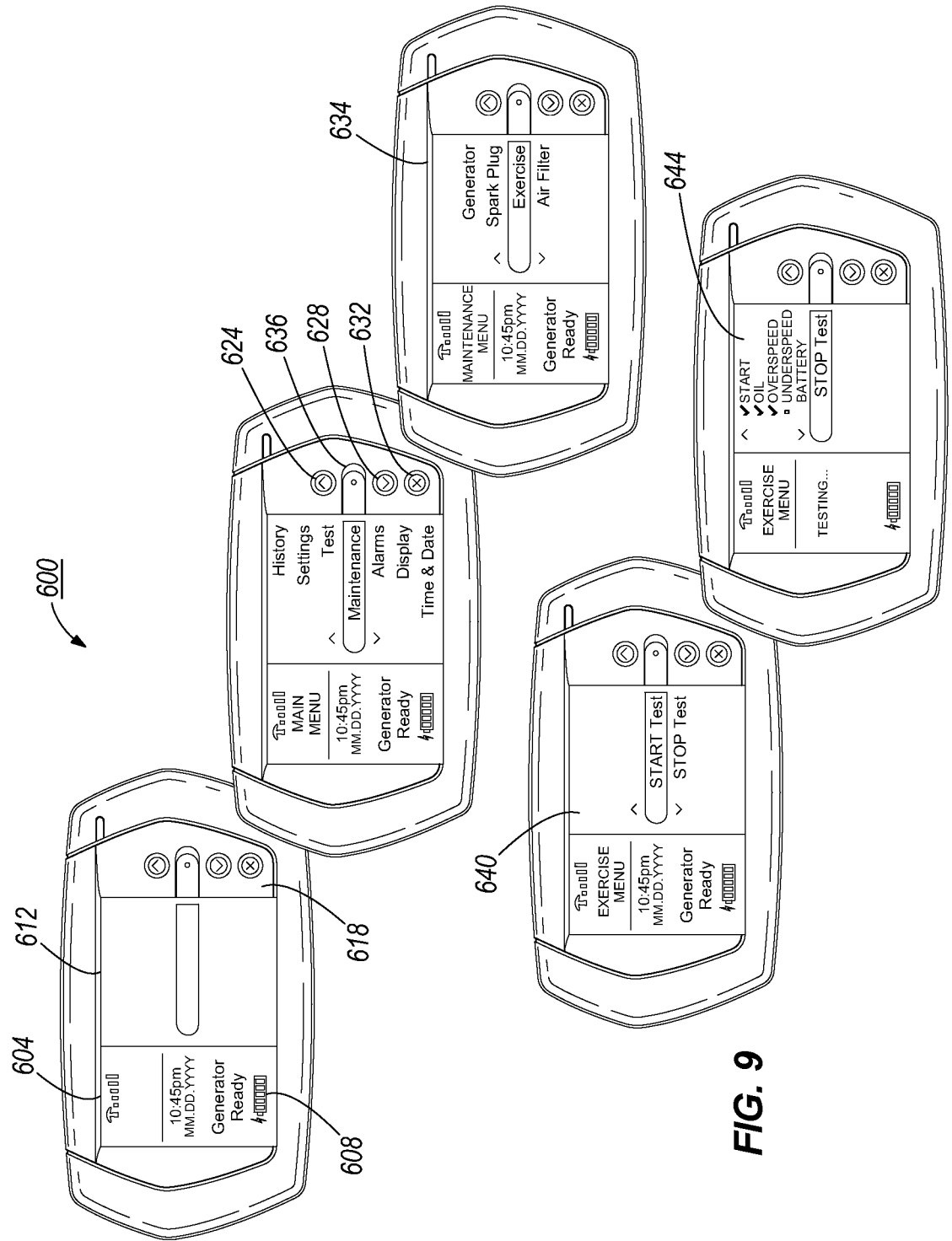
FIG. 9 is a remote information center of the system of any one of FIGS. 1-5.

FIG. 9 is an exemplary remote information center 600 that may be used with any of the systems of the present invention. The information center 600 is generally battery-powered such that the information sent out or recorded in the communication center 116 is independent of the power being provided by the generator 104 or by the utility. However, the information center 600 may also be powered by both a battery and a combination of the utility power or the generator 108. In such cases, the information center 600 has a detection module that switches between the battery source and the combination. In the embodiments shown in FIG. 9, the information center 600 has a display 604 that is subdivided into a number of areas. For example, the display 604 includes a status area 608 that indicates a status of the system, radio-frequency ("RF") signal strength, a time, a date, a generator status, a battery level of the information center 120 and a recharging state of the generator 108. The display 604 also includes a second display area or main menu selection area 612. The main menu area 612 is configured to allow a user of the system or the information center 120 to select from or scroll through a plurality of options such that a type of information of the system may be displayed on the display 604. For example, the main menu selection area 612 includes choices such as a history of the system, a plurality of settings of the system, entering the system into a test mode, entering the system into a maintenance mode, setting the system in an alarm mode, setting the information center 600 to a display mode, and setting the information center 600 to select a time and date. The main menu selection area 612 may also include other selections that are desirable for the user. The information center 600 may also include a keypad area 618 to select the choices provided on the main menu selection area 612. In the embodiments shown in FIG. 8, the keypad area 618 includes up and down buttons 624, 628 to allow a user to select or scroll through the choices on the main menu area 612. The keypad area 618 also includes a third button 632 to allow the user to return to the previously selected menu in the menu area 612. The keypad area 618 also includes a selection or enter button 636 to allow the user to select or enter into a choice from the main menu area 612. In the embodiments shown, entering into a maintenance mode has been selected by the user from the main menu area 612. Once entered, a maintenance menu 634 is shown with a plurality of selections such as generator, spark plug, exercise, and air filter. Once the exercise option has been selected, the information center 600 enters an exercise mode in screen 640 that shows options such as start test and stop test. Once the start test option has been selected, the information center 600 starts an embedded testing procedure as shown in screen 644. The procedure starts by testing an oil level of the generator 108, if the generator 108 is operating over or under a desired speed, and a battery level of the generator 108.

To access information from other locations such as a second residence or an office, a user may use an user interface such as web browser or other program through a network such as the Internet or any other communication system, and the BUI 559 to access information of the systems 100, 200, 300.

For example, the server 512 (FIG. 6) may contain an embedded web server that may serve web pages to a web browser on any connected network. In some embodiments, the user of the system, the installer, and a manufacturer of the systems 100, 200, 300 may interact with the web pages served by the server page using plug-ins or built-in firmware.

To access the information, a user has to be authenticated by the server software in a known manner. Particularly, the server page may access the information of the generator 108 via the BIU 559. In such cases, the BIU 559 is equipped with firmware, and its related software to communicate with the server 512. The firmware generally resides within the BIU 559, and provides functions such as intercommunication to and from the generator 108 or transfer switch 104 such as control parameters, network configuration, payload encapsulation such as home standby control and monitoring information, integral web server such as local access that may include TCP Internet protocol, browser-based authentication, HTML status pages for customer, HTML status and control pages that are password protected for the installer or dealer, and a DHCP IP addressing method. Furthermore, the software may also include a remote access client module. The remote access client module may include HTTP software and application programmer's interfaces ("API's") that further include server software interaction, and a dynamic self-discovery module that includes periodic heartbeat, device type identifier, alarms reporting, statistics gathering. In some embodiments, the firmware or other program also includes remote home standby software and firmware updates, and universal plug and play capability.

Furthermore, the server software generally resides on the data server 512. The server software provides the following functions: browser support such as Internet Explorer for personal computer ("PC"), Sapphire for Macintosh ("Mac"), Firefox or Mozilla for PC or Mac, portable personal digital assistant ("PDA") browsers, remote access server such as HTTP software API, firmware interaction, dynamic self discovery such as periodic heartbeat, device type identifier, SMTP client for alarms reporting, home standby database manager, hierarchical remote access privileges with level 1 that allows for administration to access database queries, firmware downloads, communication to dealers or installers, administration of current and new dealers, and target advertising to customers and dealers. The server software may also provide the following functions: hierarchical remote access privileges with level 2 that allows for installers and dealers to perform administration of current and new clients, to receive alarm and alert notifications, and to perform control and monitoring of clients' home standby units, and level 3 for customers (clients) to view the status of their own standby units.

Access to the data is organized by password protected hierarchical levels. In preferred embodiments, there are three hierarchical levels: level 1 (the administrator), level 2 (the dealer or installer), and level 3 (the client or customer). Each hierarchical level has different privileges as to the types of information that are accessible. Access may be limited to read only (R/O) or read and write (R/W), as seen in FIG. 13. Administrators have the broadest access to create and manage the information of all other levels, and may assign customers to dealers. Administrators deal directly with dealers or in some embodiments, the customers. Administrators have access to a list of all the dealers at login, and have privileges to add or delete dealers to the system.

In some embodiments, there are four levels of protected hierarchy access, which includes a second lower level of administrators, such as super-dealer or distributor, which have access to the information of their dealers and the ability to alter this information. The hierarchical structure of access to the information allows the super-dealer to view and alter the information of their own dealers, and not the information of other super-dealers' dealers. This level of protection protects the information of each super-dealer from other super-dealers. This level of protection also applies at the dealer level, where each dealer's customers' information is only accessible by that dealer and not by other dealers. The information provided to a super-dealer may be only the information on the parameters of the generators of all their dealers (alarm conditions, faults, etc) but not information that may identify the customer, i.e., the customer's name and address. This protects the privacy of the customer, and also the confidential information of the dealer so that no other dealers may contact their customers. This protects dealer's customers' confidential information from being distributed past the dealer with which the customers work. Although each super-dealer may view their dealers' customers' accounts, they cannot change parameters.

Dealer has access to the personal identification information of their own customers (clients), i.e., names and addresses. Each dealer is allowed to sort their customers by name, location, model type, or other suitable information and have access to edit and view their customers' accounts. Each dealer may set alarm notification configuration on a per customer basis of their customer's system. Upon login, the dealers will see a list of their customers sorted by customers with alarm conditions. Dealers may also install the unit, and thus be classified as installers. Thus, a dealer may also be an installer but an installer does not have to be a dealer.

Figure 10A:
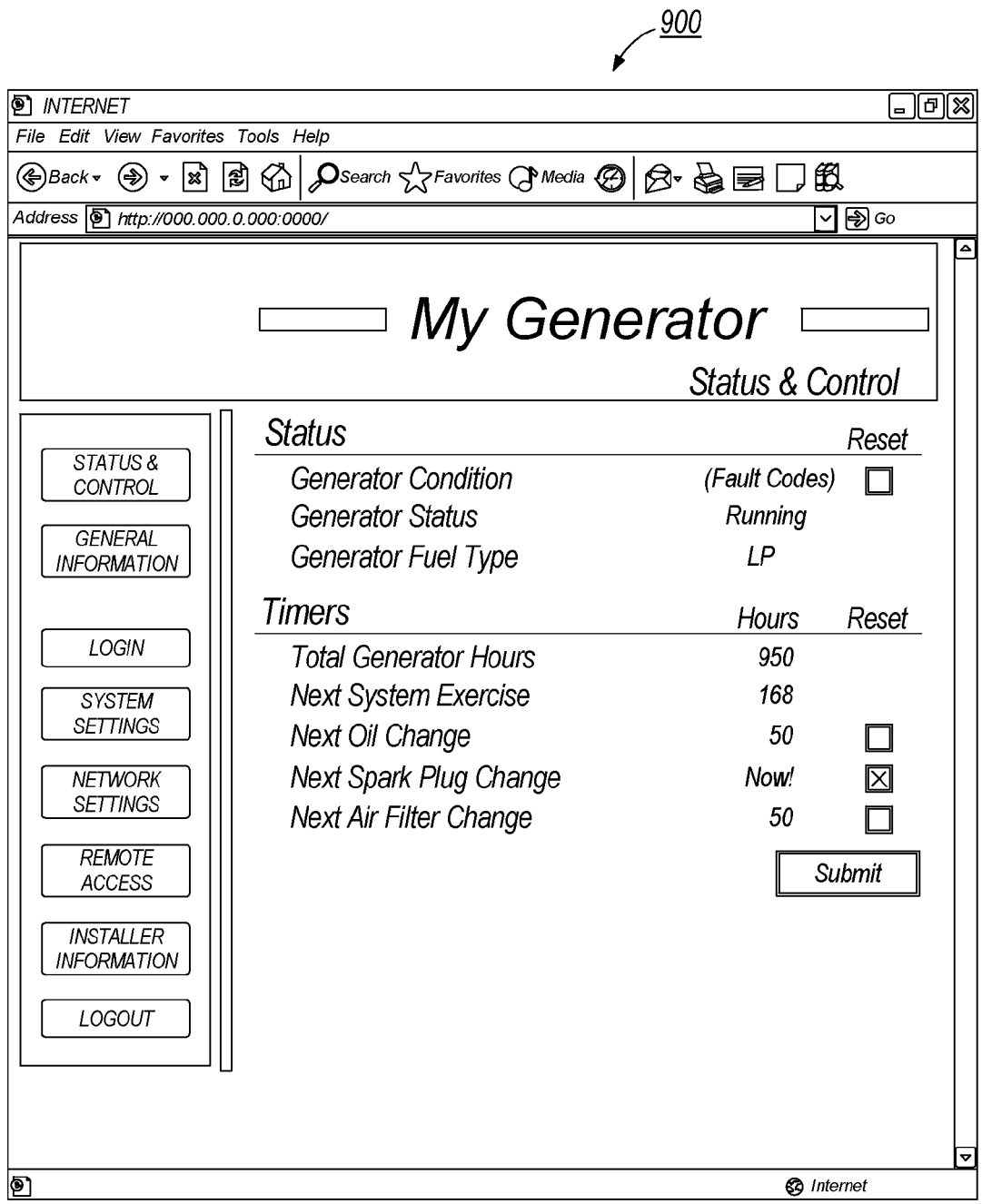
FIG. 10A is a screen display of information of the system of any one of FIGS. 1-5 depicting Status and Control Information about the generator system.

For the following screen displays, the screen display may be on any suitable user interface. Suitable user interfaces include graphical user interfaces, such as web browsers, or a text screen interface, or a printer. FIG. 10A is a screen display 900 of information of the system of FIGS. 1-5 using a user interface, such as a web browser. The screen display 900 may be viewed by both the customer and the installer or dealer. If the customer chooses to change his or her own oil, spark plug or air filter, each timer may be reset by checking the appropriate box and pressing or selecting a Submit option. The screen display 900 shows the generator condition, the generator state, the generator fuel type, the total number of generator run time hours, the next scheduled system exercise, the next scheduled oil change, the next scheduled spark plug change, and the next scheduled air filter change. The screen display 900 also has some reset buttons to allow the user to reset a respective option.

Figure 10B:
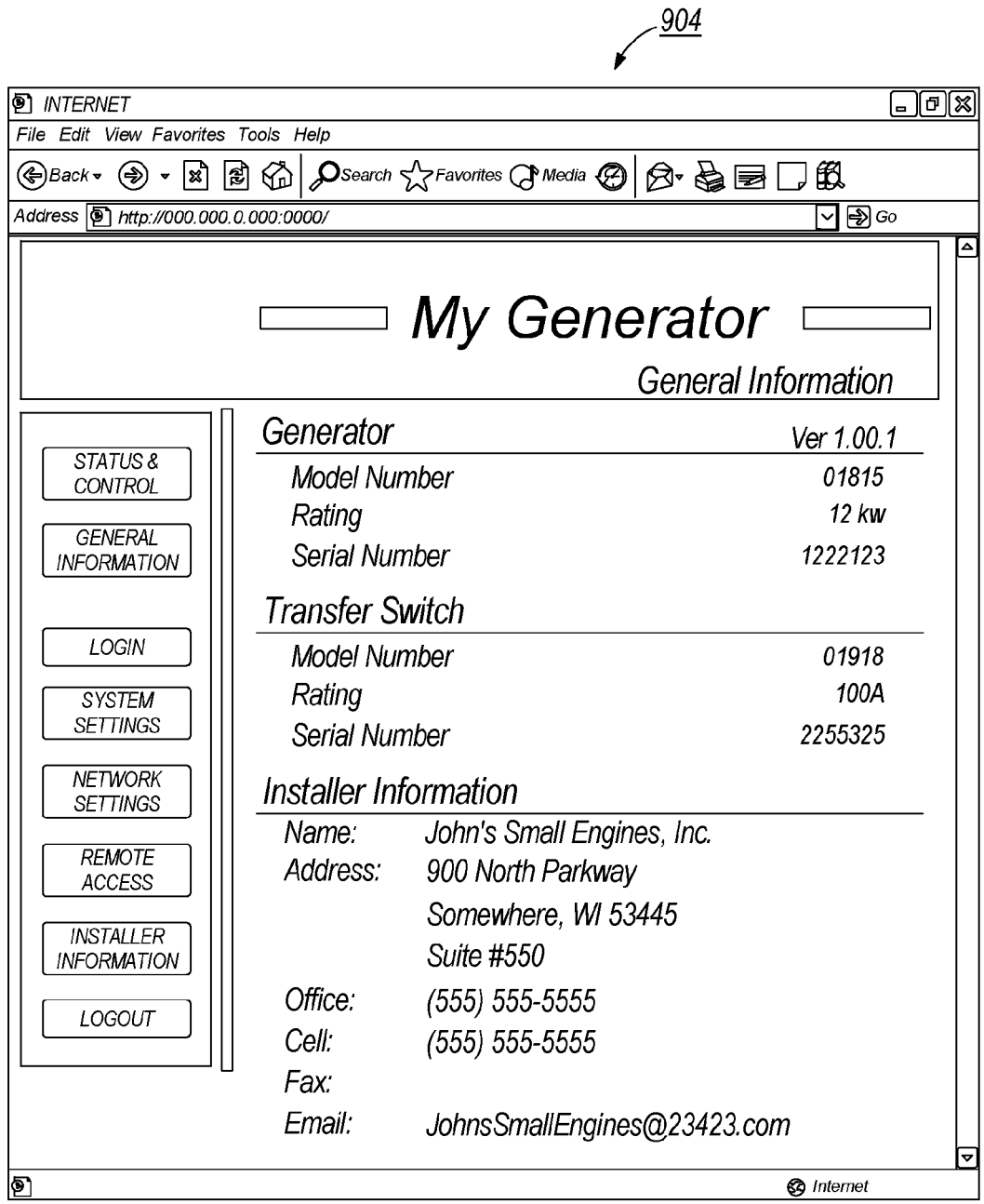
FIG. 10B is a screen display of information of the system of any one of FIGS. 1-5 depicting General Information about the generator system.

FIG. 10B is screen display 904 of information of the system depicting the General Information of the client's generator. The screen display 904 may be viewed by both the customer and the installer or dealer. Both the customer and the installer or dealer may view pertinent information required for service without accessing protected pages. For example, the customer and the installer may view information such as a model number, a rating and a serial number of the generator 108. The customer and the installer or dealer may also view information such as a model number, a rating, and a serial number of the transfer switch box 104. Furthermore, the customer and the installer or dealer may view other information such as information of the installer or dealer.

In some embodiments, some web pages may only be accessed after authentication with a proper username and a password. The username and password pair is only intended to be used by an authorized installer. Parameters within these pages may be changed by qualified installers or dealers. The password protected page group includes system settings, network settings, remote access, and installation information pages.

FIG. 10C is a screen display 908 of information of the systems of FIGS. 1-5 depicting System Settings. The screen display 908 may include generator settings, transfer switch settings, timer settings, and system exercise settings. The timers may optionally be set to notify the customer and the installer or dealer upon expiration, by email, phone call, text message or facsimile. Other settings include default durations and intervals.

Figure 10D:
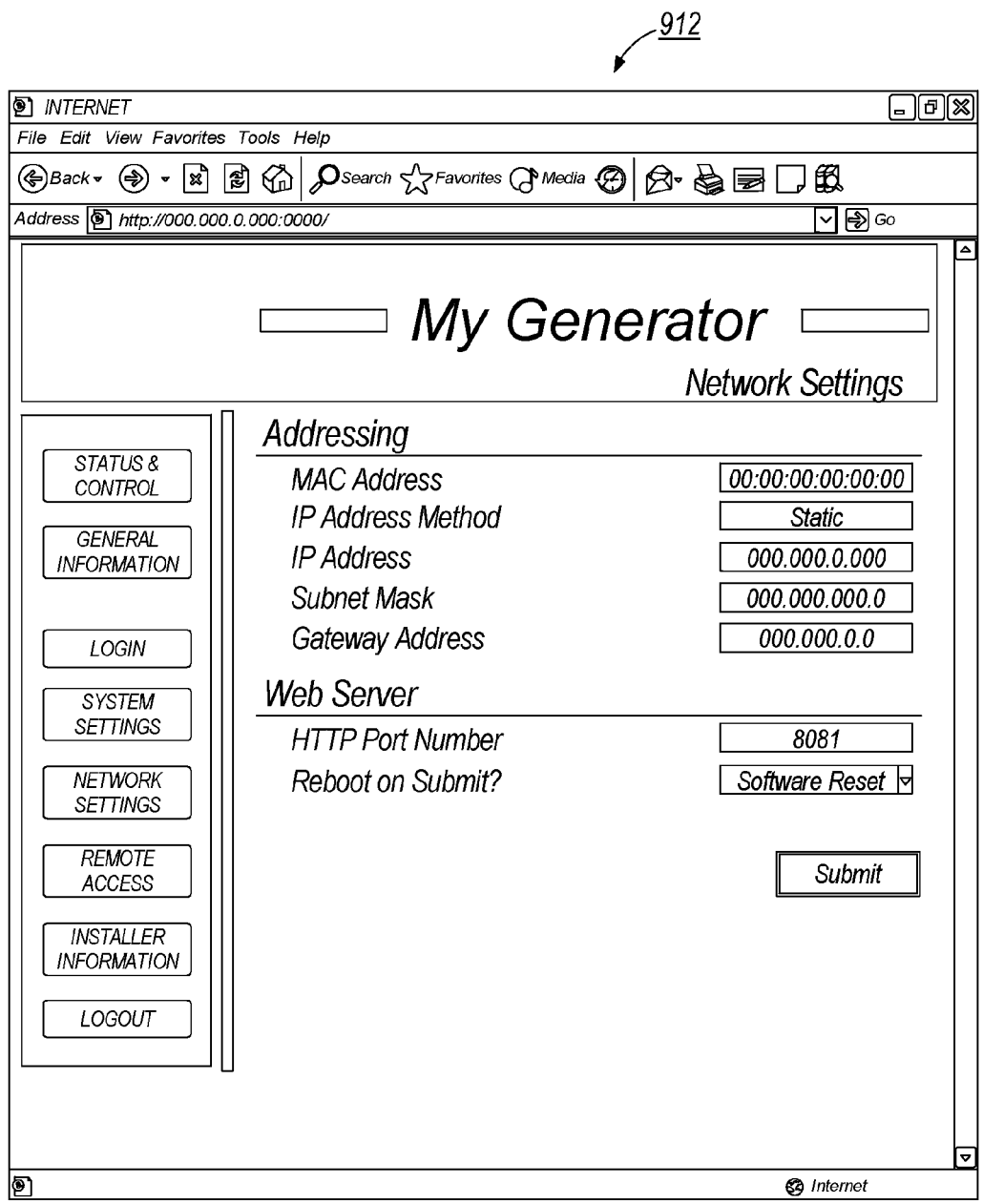
FIG. 10D is a screen display of information of the system of any one of FIGS. 1-5 depicting the Network Settings of the system.

FIG. 10D is a screen display 912 of the systems of FIGS. 1-5 depicting the Network Settings. The screen display 912 shows network settings parameters and information that should be entered by qualified installers. Specific network-related parameters are configured on this page. The network settings include addressing parameters such as MAC address, IP address method, IP address, subnet mask, gateway address, and web server parameters such as HTTP port number and reboot on submit settings.

Figure 10E:
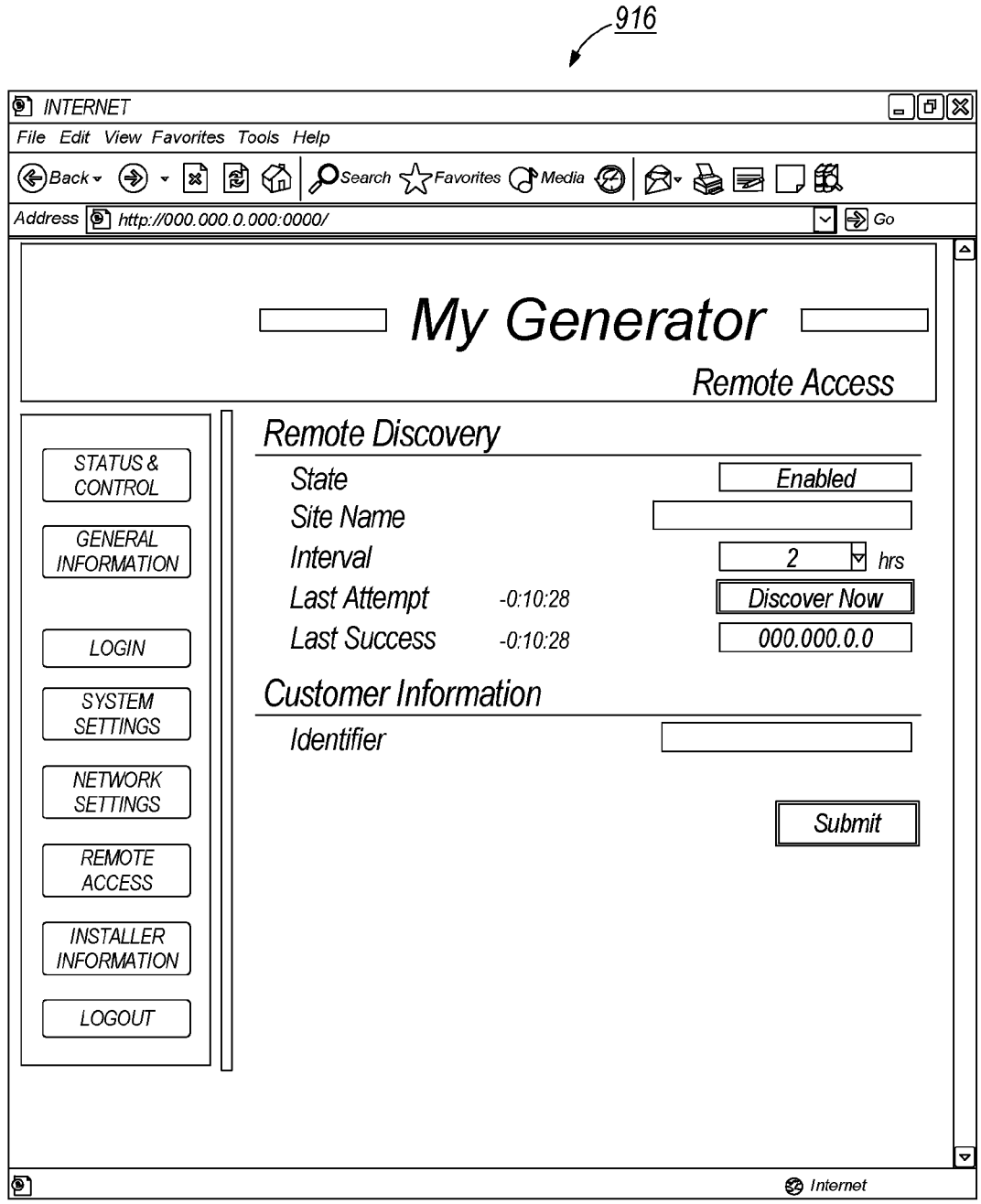
FIG. 10E is a screen display of information of the system of any one of FIGS. 1-5 depicting the Remote Access Settings of the system.

FIG. 10E is screen display 916 of information of the systems of FIGS. 1-5 showing some Remote Access Settings. The remote access setting parameters and information are entered by qualified installers only. Specific remote management-related parameters are configured on this page. Both a site name and a customer ID are required to enable intercommunication with the server software to perform remote management. The remote access parameters include remote discovery parameters such as state, site name, interval, last attempt, and last success. Customer or client information is also part of the remote access parameters. The customer information includes an identifier which identifies the customer.

FIG. 10F is a screen display 920 of information of the system of FIGS. 1-5. The screen display 920 includes installer information that may be entered by qualified installers. Specific installation related parameters are configured on this page. The installer information may include installation date, and installer information such as company and email addresses as shown.

Software on the server 512 runs on a secure and highly reliable qualified server that interacts with the customer and installer or dealer for remote management capability. In addition, authorized administrator personnel may access the server to administer new installers, push software and firmware upgrades down to the generator 108, and extract statistics to be used for sales, marketing or service reasons. Customers, installers and administrators may interact with the server software through a common web browser or other user interface found on a standalone PC, portable laptop or mobile computing device. A browser based login authentication method is preferably employed before either a customer or installer may access any of the following pages. In the following exemplary server software pages, a manufacturer's administrator has logged in to the server 512 to administer an installer or dealer account or perform database queries such as searches.

Figure 10G:
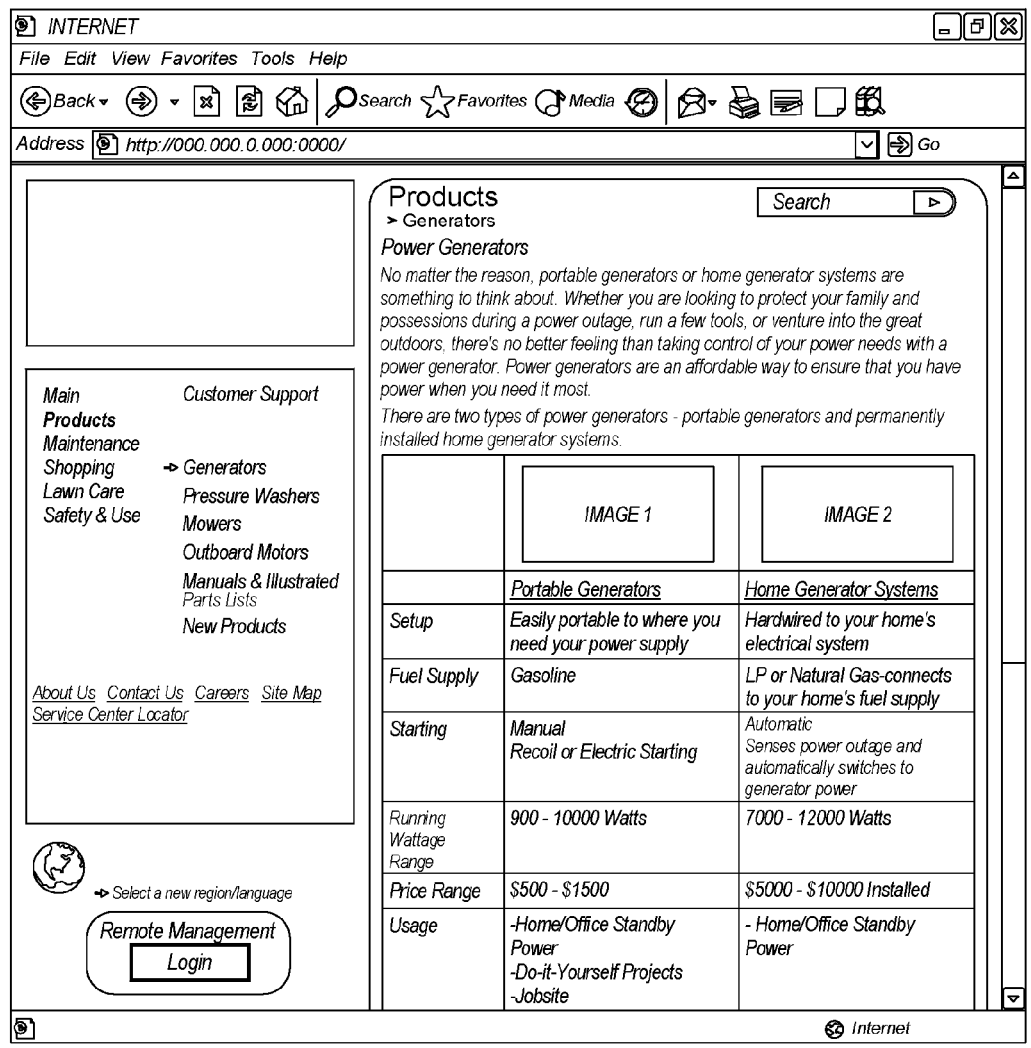
FIG. 10G is a screen display of information of the system of any one of FIGS. 1-5 depicting General Product Information and Log In of the system.

FIG. 10G is a screen display 924 of information of the system of FIGS. 1-5. The screen display 924 shows a login page. The customer, an installer, or the manufacturer's administrators may access the remote management site by first logging in from a power generator page on the manufacturer's web site. The manufacturer's web site page then provides a link which redirects the user to the remote management authentication page. In some embodiments, after logging in the remote management site, the manufacturer may find all generator units installed and sold by a particular installer. To locate the generator units, the communication center 116 or the interface 120 contains an identification that uniquely identifies a particular system and its parts. In some embodiments, the identification of the particular system and other information about the particular system are all stored on the server 512 for network access. If any service is performed on the particular system, the information about the particular system is updated and transmitted to the server 512 via the Internet, via another publicly-accessible network, or directly via a telephone or other communication medium. In some other embodiments, the identification of the particular system is securely broadcast over the network 540 upon a software search or interrogation request from the server 512. In this way, the server 512 only gathers information about the particular system when necessary. Furthermore, the communication center 116 or the interface 120 that stores the information about the particular system will transmit the information to the server 512 via the network 540. In some embodiments, the identification of the particular system may include a combination of the information shown in the screen displays 900, 904, 908, 912, 916, 920. In yet some other embodiments, the communication center 116 or the interface 120 is equipped with a broadcast device to search for the server 512. Once the server 512 has been located, the communication center 116 or the interface 120 may transmit information about the particular system to the server 512 for further processing. In this way, the communication center 116 or the interface 120 locates and transmits the information directly to the server 512. In yet some other embodiments, the communication center 116 or the interface 120 and the server 512 may use a combination of the networking techniques discussed earlier.

Once logged in, the manufacturer, the dealer, the installer, or the client may perform a plurality of functions using the remote management site. For example, the administrator may use the remote management site to find all the generator units of a particular type or model. The manufacturer may also find all the installers that have installed all the generator units of a particular type or model. In some cases, the manufacturer may also geographically locate all the generator units of a particular type or model that have been installed, and determine service frequencies and failure frequencies of all the generator units of a particular type or model.

Figure 10H:
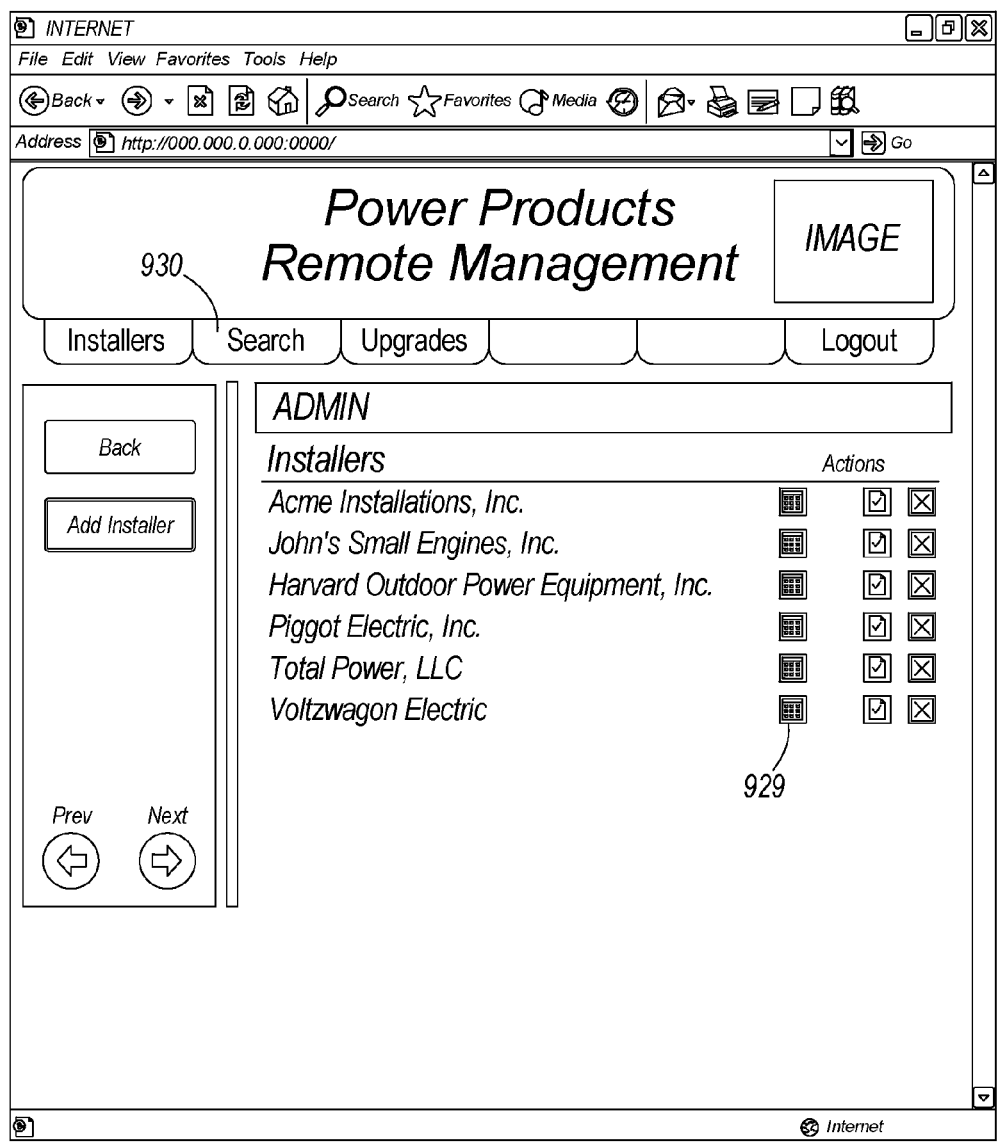
FIG. 10H is a screen display of information of the system of any one of FIGS. 1-5 depicting the information seen by an administrator showing Installers.

FIG. 10H is a screen display 928 of information of the system of FIGS. 1-5. The screen display 928 shows a server installer page that may be viewed by a manufacturer's administrator after a successful login. Specific installation-related parameters are configured on this page. In some embodiments, the installer page lists all the authorized installers that have installed generator units for the manufacturer. Alternatively, the installer page may also list all the authorized installers that have installed a particular generator unit for the manufacturer. In the embodiment shown, the information includes a list of installer names. As shown in FIG. 10H, the manufacturer's administrator may also check on a profile of each of the authorized installers on the list by selecting a view profile option 929. Through the server installer page as shown in the screen display 928, the manufacturer's administrator may also perform other administrator functions such as selecting some of installers such that the profiles of the selected installers may be compared, and deleting an installer from the page. Also shown on the server installer page are a "search" tab 930, an "upgrades" tab, a "client's" tab, and a "logout" tab, which are discussed below with respect to different screen displays. The profile of each of the authorized installers includes information such as names of clients, dates of installations and services, dates and amount of generator usage, amount of generator power provided, and the like.

Figure 10I:
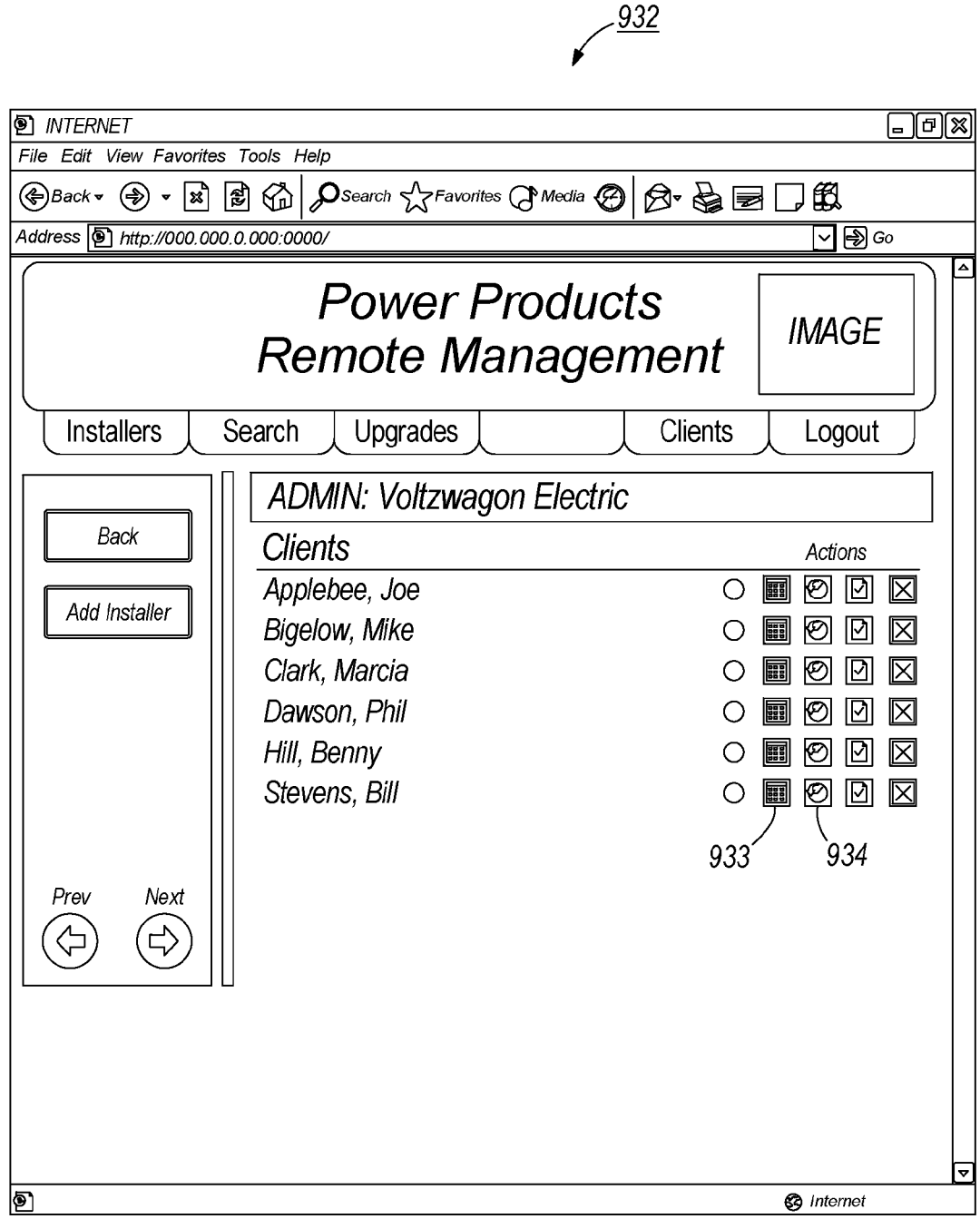
FIG. 10I is a screen display of information of the system of any one of FIGS. 1-5 depicting a Customer (Client) page as seen by an administrator.

FIG. 10I is a screen display 932 of information of the system of FIGS. 1-5. The screen display 932 shows a client page that is accessed by clicking on the view profile button 929 next to an installer on the screen display 928. Once entered, the manufacturer's administrator may locate a list of client names whose generator units are installed by the respective installer selected in the screen display 928. The client page also provides links to other information for each of the clients listed. For example, the client page shows an alarm state of each of the clients that indicates a state of the respective generator unit. The client page also provides links to profiles of the clients, installation history of the respective generator unit, faults experienced by each generator unit, and the like. In some embodiments, the manufacturer's administrator, the installer, or the client may adjust information or settings on the respective generator unit of a particular client.

Figure 10J:
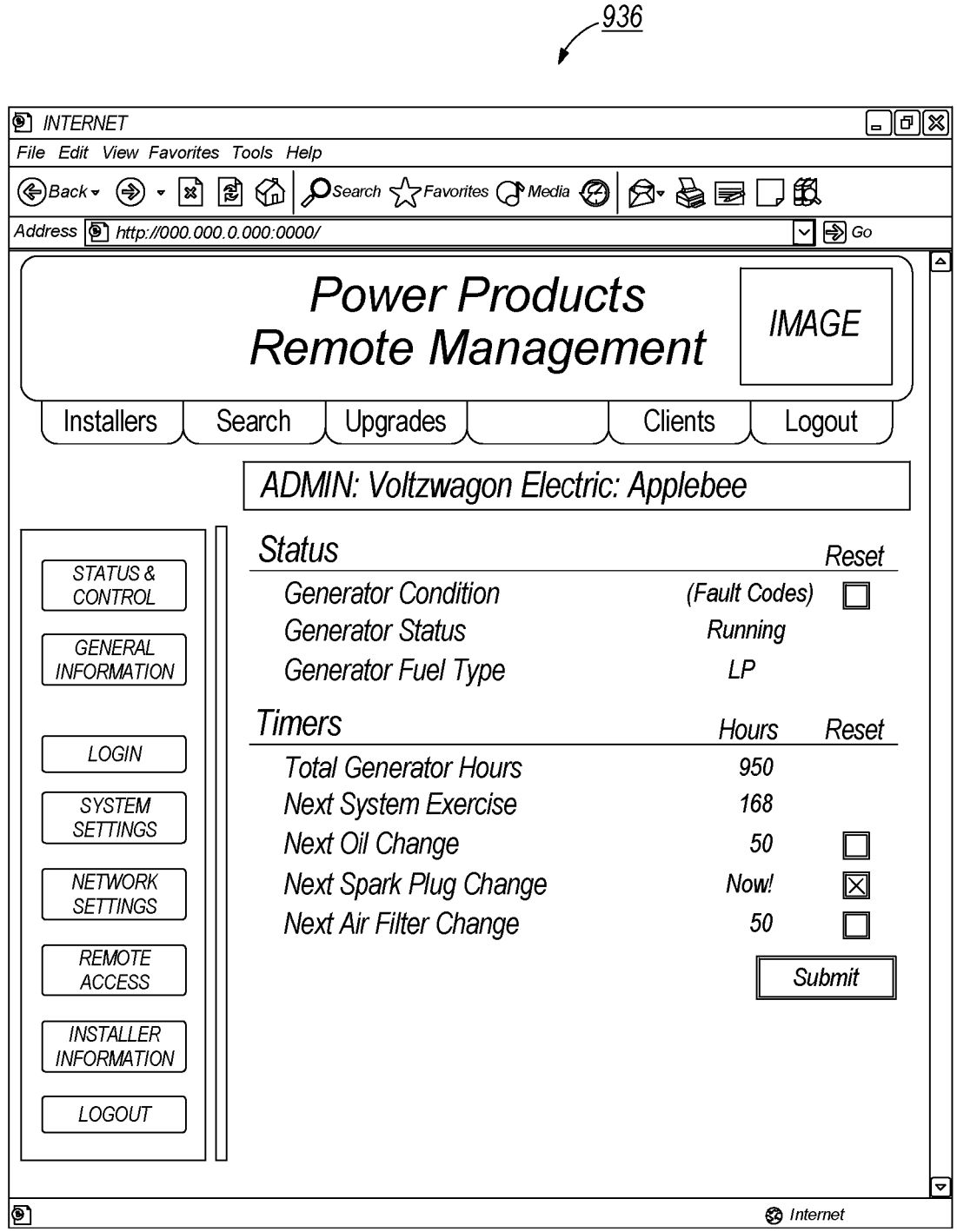
FIG. 10J is a screen display of information of the system of any one of FIGS. 1-5 regarding information regarding a selected client's generator system.

FIG. 10J is a screen display 936 of information of the system of FIGS. 1-5. The screen display 936 shows an interface page that is accessed by clicking on a view profile button 933 next to a client (customer) on the screen display 932. The interface page shows information of the generator unit of the selected client. Exemplary information includes generator status and timer settings. In this way, the manufacturer's administrator may adjust parameters of the generator status and timer settings. For example, the manufacturer's administrator may reset a generator status such as generator condition to "default" from "fault." The manufacturer's administrator may also adjust or reset timers relating to maintenance of the generator unit such as a scheduled time for a "next spark plug change."

Figure 10K:
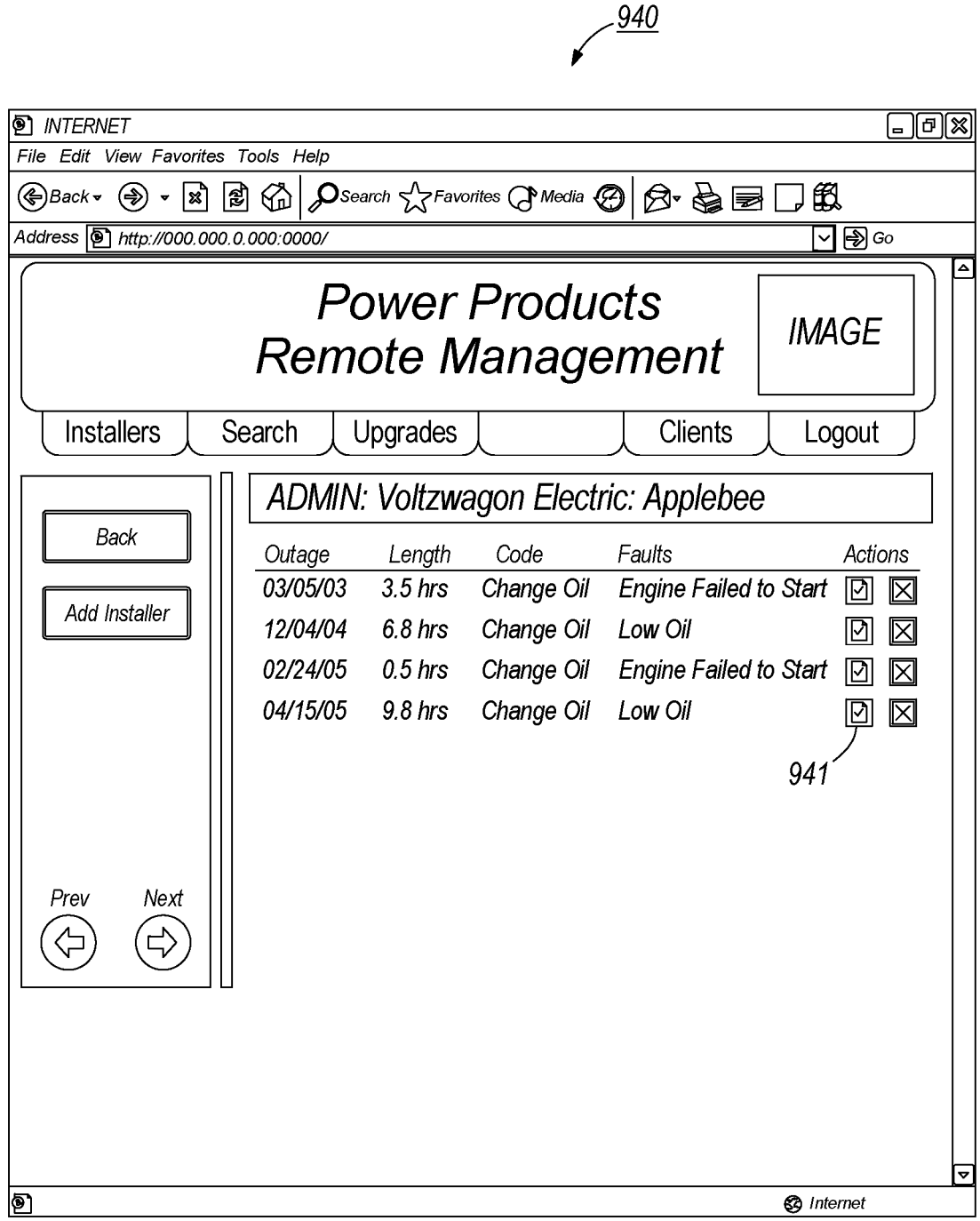
FIG. 10K is a screen display of information of the system of any one of FIGS. 1-5 regarding information regarding prior power outages for selected clients.

FIG. 10K is a screen display 940 of information of the system of FIGS. 1-5 showing a history page. The history page is accessed by clicking on a history button 934 next to a client on the screen display 932. The information shown on the screen display 940 includes types of faults experienced by the generator unit, a code indicating an action taken to resolve the types of faults, a length of operating time since a last action was taken, and a date on which the action was taken, and the like.

Figure 10L:
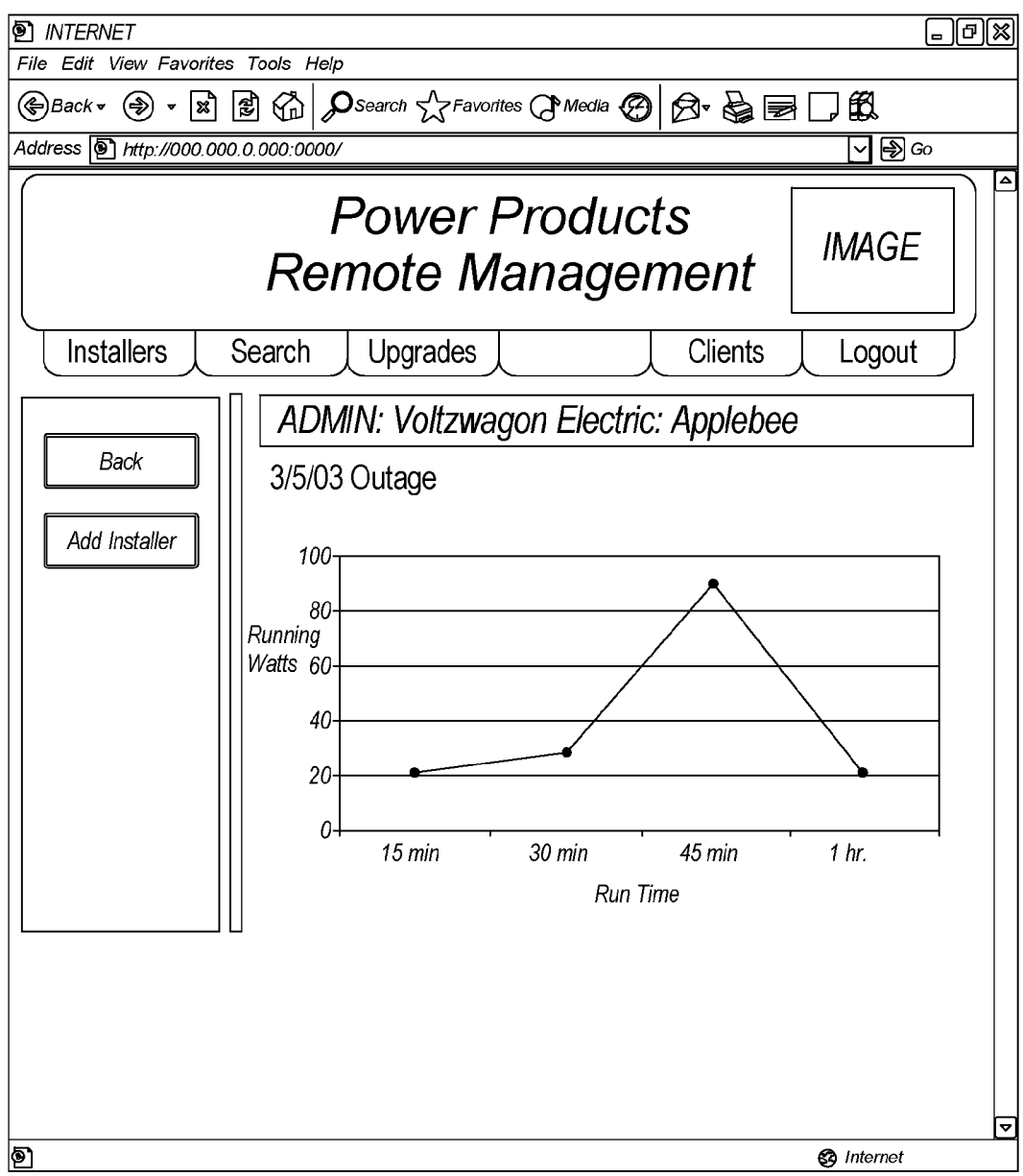
FIG. 10L is a display of information of the system of any one of FIGS. 1-5 regarding a specific selected power outage for a selected client.

FIG. 10L is a screen display 944 of information of the system of FIGS. 1-5. The screen display 944 shows a server histogram page that is accessed by clicking on a "properties" button 941 next to an outage event on the history page as shown in screen display 940. Particularly, the manufacturer's administrator may view a history of an outage of the particular generator unit owned by the selected client on the history page as shown in the screen display 944. In the embodiment shown, a histogram of running power versus run time during an outage on Mar. 5, 2003 is shown. The histogram, for example, shows that after 45 minutes of run time, the running power is about 90 watts, which may indicate an engine failure.

Figure 10M:
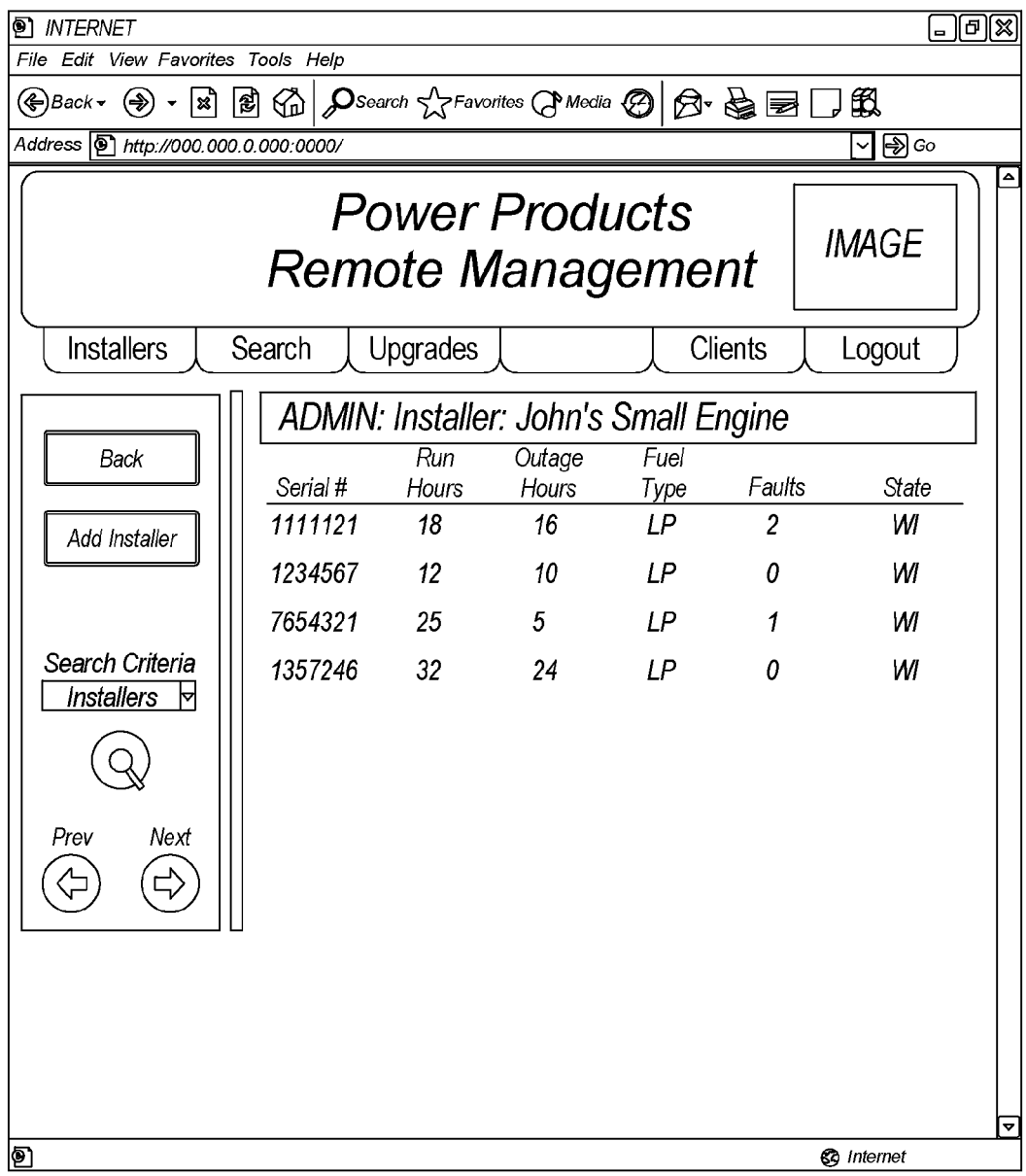
FIG. 10M is a screen display of information of the system of any one of FIGS. 1-5 regarding client systems of a selected installer.

FIG. 10M is a screen display 948 of information of the system of FIGS. 1-5. The screen display 948 shows a search page that may be accessed by clicking on the search tab 930 under the remote management page as shown in the screen display 944. With the search page, the manufacturer's administrator may search all the generator units of a particular type or model, locations of the generator units, service frequency experienced by the generator units, faults experienced by generator units that were installed by a particular installer or sold by a particular dealer, and the like. In some embodiments, the search criteria may include information such as, but not limited to, model number, serial number, power rating, a name of the installer or dealer, a name and other information of the client, running hours, fault types, fuel type, software program version, and the like. The search criteria may also include information based on geographical regions. In this way, the manufacturer's administrator may analyze the information generated by the search page. For example, the manufacturer's administrator may determine if a particular generator type or model is more susceptible to engine failure than other type or model. For another example, the manufacturer's administrator may determine if a particular generator type or model installed by a specific installer or serviced by a specific dealer experiences more faults than the particular generator type or model installed by another installer or serviced by a different dealer.

An embodiment of the software architecture of the system 100, 200 or 300 is depicted in FIG. 11. Four tiers are depicted, three of which are within the data server 512: a data storage tier 550, a business tier 552, and a presentation tier 554. The fourth tier is the client tier 556, which includes the broadband interface unit BIU 559 that communicates information from the client's generator 108 to the server tiers. The client tier 556 includes the broadband interface unit (BUI) 559 and user interfaces 516 (such as a PC or laptop computer). The server side receives BIU status, alarms and counters, performs BIU configuration, and provide automatic BIU upgrades to the BIU 559. The client tier 556 also includes a user interface accessed through the computer 516.

On the server side, central management system (CMS) data server 512 contains the user interface to the system (e.g., a web interface), the database 832 (FIG. 12), the business logic, and the presentation layer 554. The business logic includes alarm notification and delivery. The presentation layer 554 includes web pages and a graphic user interface such as a web browser. The presentation layer 554 is integrated with data storage layer 550. The presentation layer 554 also contains the application server, e.g., JBOSS.

The presentation tier 554 includes a user interface including a Hyper Text Transfer Protocol (HTTP) server. HTTP is an application protocol that enables web browsing. The presentation tier 554 also includes web application pages which include the administrator pages 558, the dealer pages 556 and the customer pages 560.

The business tier 552 collects status information from the generators through the BIU interface 559, the database within the server and the user interface, e.g. the web applications. The BIU interface data includes alarm notifications and counter updates.

The storage tier 550 includes a database server 512 that includes resilient data storage for data replication (redundancy), and a relational database, e.g., dBase or R:Base. Another part of the storage tier 550, the web host, has high availability, e.g., connects to multiple users simultaneously, is scalable to multiple sites, such as mirror sites, and undergoes regular backups and maintenance.

In one embodiment, the presentation tier 554 includes four hierarchy or password-protected levels: administrator, super-dealer, dealer and customer. Each of the hierarchy levels has different access privileges. Administrators may create and manage the accounts of super-dealers, dealers and customers. Administrators may also assign customers to dealers. Each dealer may create and manage their own customers' accounts. Customers may only manage portions of their own account. Administrators may oversee super-dealers, dealers or customers as their delegates. Dealers may only oversee customers as their delegates.

The client or dealer (who supplies the generator system to the client) choose the notification strategy for the monitoring system. The client or dealer may receive notification of events through a contact, e.g., an e-mail, short messaging service (SMS) messages, facsimile, or phone. Notifications may be enabled and disabled on the following three levels of severity: Fault, Warning and Notify. "Fault" notifications relate to hardware errors and generator fault codes, e.g., generator system fault code or BIU POST failures. "Warning" notifications relate to a generator system 108 or BUI interface error. "Notify" notifications relate to the status of operation of the generator, e.g., nearing an air filter change cycle or a power failure. Up to 10 address rules may be specified as contacts. Each customer may opt out of their dealer receiving notification, e.g., the customer may receive the warning message, i.e., low oil, and the user may fix it without the dealer being notified or contacted, and the customer or client may specify the types of notifications their dealer receives.

In some embodiments, there may be multiple administrator-level accounts. In this embodiment, there is a sub-administrator tier, e.g., a super-dealer or distributor tier. The administrator may add or delete dealers, super-dealers and clients or customers. Super-dealer may be distributor which may sell to dealers. Each super-dealer may create and delete their dealers' accounts. The super-dealer may assign and re-assign customers to their dealers' accounts. Each super-dealer may view their dealers' customers' accounts but cannot change parameters (read only, R/O). Each Super-dealer may assign themselves to receive dealer notifications. Each Super-dealer cannot receive information on the dealers of other super-dealers.

At the dealer level, the dealers may see a list of their own customers, sorted by customers with alarm conditions, when they log into the web host. Each dealer may sort their customers by a number of different parameters, e.g., name, location, model type, etc. Each dealer may edit and view their customers' accounts but not the accounts of customers of other dealers. Each dealer may set alarm notification configurations on a per customer basis.

Customers may only see their own account information when they log in to the user interface, e.g. web server. Customers may only edit certain parameters, e.g., their contact information and their notification configuration. Then customers may view their system information such as listed in FIG. 13 and FIG. 16. The customer's system's configuration may only be viewed and not edited by the customer (read-only, R/O). The customer's dealer may only change their own customer's system configuration. Each customer may view the contact information of their dealer and may opt out of having their dealer be notified of events relating to their generator system, e.g., alarms and warnings. The customer may choose to receive information on the status of the generator, the alarms and counters. The user interface allows changes to the organization of the data displayed.

Figure 12:
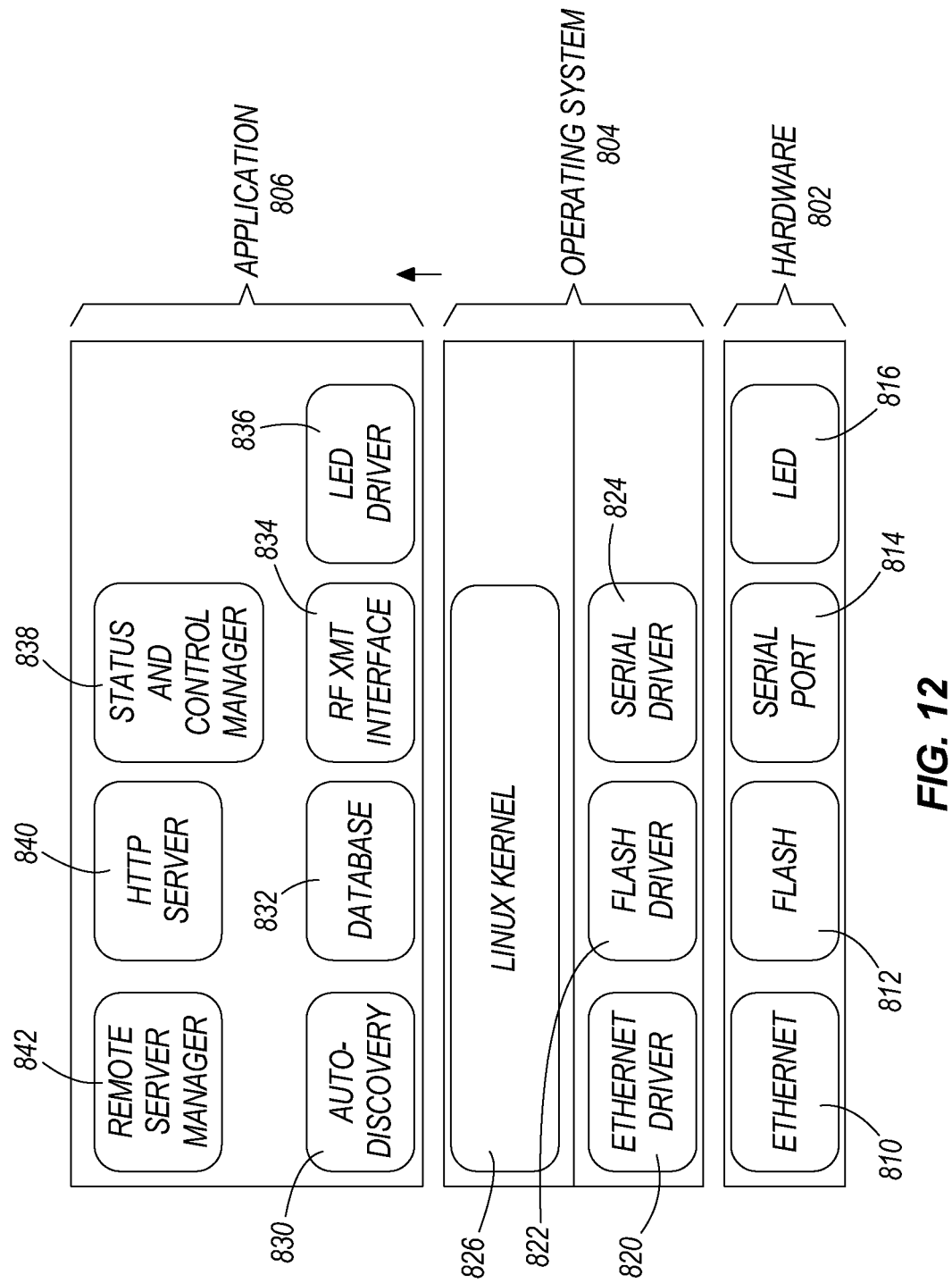
FIG. 12 is a diagram of the system software architecture.

In some embodiments, the architecture on some or all the server side is as depicted in FIG. 12, including hardware 802, operating system 804 and application 806. The system contains an operating system and driver, including Linux kernel 826, an Ethernet driver 820, a flash driver 822, and a serial driver 824. The operating system controls the remote server manager 842, the HTTP server 840, the status and control manager 838, the auto-discovery 830, the database 832, the RF interface 834 and the LED driver 836. The associated hardware 802 includes the Ethernet 810, flash memory 812, serial port 814 and LEDs 816. The operating system and drivers used are preferably a hardware specific Linux kernel 826 and low-level interface drivers. In some embodiments, the serial port and Ethernet drivers are integrated into the kernel. The auto-discovery/zero-configuration 830 mechanism are defined and partially integrated with Linux kernel 826.

In some embodiments, as depicted in FIG. 12, the system's Linux 2.6 kernel 826 includes a flash file system 822 (persistent storage) used for fault tolerant and writing leveling by design, network drivers 820 and port drivers 824. The system further includes a RF interface application 834 which implements the RF transmitter interface protocol, monitors the health of connection to the RF transmitter by e.g., checking for transmitter presence, bit errors, and protocol errors, and notifying the central monitoring system of each type of error through the BUI 559. The RF interface application translates protocol messages to current generator status. The web interface includes a local HTTP server and access to current status, statistics, and configuration from the local network. The remote server manager 842 packages all BIU status and statistics into periodic web-services and messages of the control monitoring system of server 512, and reliably delivers the messages. The status and control manager 838 includes alarm notification and logging and CMS message initiation. Auto-discovery/zero-configuration unit 830 includes a windows browser interaction and DHCP/AUTO-IP Network Configuration.

In some embodiments, the generator system configuration includes the BIU 559 having local storage where configuration parameters are stored. The system configuration parameters are also stored by the central monitoring system server 512. A list of the parameters stored in the system, including the CMS server, are shown in FIG. 13. As shown in FIG. 13, some parameters may be accessed by the customer (client) or the installer (dealer), either as read only (R/O) or read/write (R/W).

Generator status information is delivered periodically to the BIU 559 and the data server 512. The data server 512 recognizes the status information of the generator 108 shown in FIG. 14. The status information also includes status counters. These status counter values may be displayed in intervals, e.g., since instillation, previous 24 hours, previous week, pervious month, or previous year. The server's counters include an event counter and an epoch counter. The event counter counts the number of times an event has occurred, e.g., low voltage events, or transfer switch engagements. The epoch counters count the number of hours and minutes that a condition has been true, e.g., the total run time or time till next automatic exercise cycle. The system's status counters are shown in FIG. 15, including events, e.g., run time, total transfer switch engagement time (amount of time generator has been providing backup power), spark plug run time, air filter runtime, oil filter run time, time till exercise, remaining exercise time, and epoch counters, e.g., switch engagement, low battery voltage, low voltage, engine fail to start, low frequency, e.g., below 55 Hertz, engine overspeed, oil temperature high, transfer switch fault, or total shutdown.

In some embodiments, the data server 512 logs information in the system's persistent storage. The information logged by the server 512 includes generator system events, BIU events shown in FIG. 16, and log ins replicated in the server 512. The events contain the number, date, type and message text.

The central monitoring system (CMS) server 512 interactions include system-initiated polling which works through the HTTP-Proxy without configuration. The default polling interval is 5 minutes, which has minimizes impact on the CMS performance. The default polling interval changes to one minute during generator operation, and the polling change may be initiated by the CMS. The system-initiated polling uses low bandwidth since only small messages are sent and only changed data is sent. The CMS interactions also include status messages sent to the CMS including current status, faults and counter updates. The CMS interaction also includes the status message return, including CMS initiated configuration changes and automatic system upgrades.

The boot sequence of the system includes the power on self-test (POST). The POST includes checking the DRAM, FLASH, real-time clock, and passes results for non-fatal boots to the operating system (OS). The boot sequence includes boot Linux and system diagnostics including, e.g., checking generator system interface, Ethernet, and connection to CMS data server 512. If the system diagnostics find fault in the generator system, the GSI LED blinks. If the system diagnostics finds fault in the Ethernet, then the Ethernet LED blinks. If the system cannot contact the CMS, the CMS LED blinks.

Runtime of the system includes gathering status from the generator interface, updating the counters, updating the log, generating CMS status message, delivering status to the CMS, command received from CMS, run system diagnostics and repeat.

FIG. 17 depicts an exemplary web interface status information as displayed on a user interface. FIG. 18 depicts an exemplary generator system information displayed on a user interface. FIG. 19 shows exemplary values of the web interface counters displayed on a user interface. FIG. 20 shows an example of the web interface event logging information displayed. FIG. 21 is an example of the web interface network configuration settings as displayed on a user interface. FIG. 22 depicts an exemplary web interface dealer contact information displayed on a user interface. FIG. 23 shows an exemplary web interface owner contact information displayed on a user interface.

For some embodiments, the BIU hardware is as depicted in FIG. 24. The hardware includes a EP9302 16 bit 200 MHz embedded processor 950, flash memory 952 of at least 32 MB at least 64 MB SDRAM 954, a real time clock 956 (RTC with battery backup 957), a 802.3 10BaseT/100Base-TX interface 962, a RJ45 connector, a RS232 interface 960 via a terminal block connector, reset to factory setting switch (POR) 968, and a power supply 966. The hardware may optionally include an USB interface 968 for 802.11b-802.11n wireless connectivity. The power supply 966 is preferably a 5VDC AC/DC wall power supply via a P5P plug. An optional power supply is Power over Ethernet (PoE) 964.

In some embodiments, the BIU unit 559 has several indicator LEDs. The system indicator LEDs 816 (FIG. 12) are power, Ethernet, generator system interface (GSI) and central monitoring system (CMS). The power LED indicates that BIU power is present. The Ethernet LED indicates the 10Base/100Base-TX Network is accessible. If the Ethernet LED is not on, the LEDs will provide further network diagnosibility. The GSI LED indicates the generator system interface, e.g., RS232, is accessible. The CMS LED indicates the BIU may communicate with the CMS server 512. Two additional 802.3 LEDs are in communication with the RJ45 connector, linking LED ON if network link is present and activity LED ON if network activity present.

The installation procedure includes preparation before site installation and site installation. Preparation before site installation includes dealers recording the following information: generator name, model number, serial number, transfer switch model number and serial number, and BIU serial number. Preparation further includes having the dealer log into the manufacturer server and create customer accounts. A customer account includes the customer ID, name, address, phone and e-mail, and recorded information on the generator, transfer switch and BIU. Site installation includes the dealer or its delegate installing the generator system and BIU. The BIU is preferably mounted to the wall on two screws. Ethernet cable is attached from the BIU RS232 connector to the RF transmitter and to the BIU. The application boots and proceeds to verify that the interfaces are active, and the system LED provides status. The BIU discovers the server 512 and is accessible from the dealer account.

What is claimed is:

1. A hierarchically accessible monitoring system for use in a manufacturing supply chain that includes a manufacturer, a dealer, and a client, the system comprising:
a plurality of standby generators each manufactured by the manufacturer, each standby generator including an interface unit configured to receive information from the standby generator and to communicate the generator information;
a remote data server in communication with the interface unit, wherein the remote data server receives the generator information from the interface unit, stores the generator information, and controls access to the generator information based upon at least three hierarchical levels, each hierarchical level having different access privileges; and
a user interface configured to display the generator information from the remote data server to at least one user, wherein the user has access privileges to read the generator information based upon the user's assigned hierarchical level;
wherein a first of the at least three hierarchical levels is associated with the client and has access privileges to read a set of generator information related to only one of the plurality of standby generators, a second of the at least three hierarchical levels is associated with the dealer and has access privileges to read the set of generator information related to only a subset of the plurality of standby generators, the subset including more than one standby generator and fewer than all of the plurality of standby generators, the subset also including the one of the plurality of standby generators accessible by a user having the first of the at least three hierarchical levels, and a third of the at least three hierarchical levels associated with the manufacturer that has access privileges to read the set of generator information related to all of the standby generators of the plurality of standby generators, wherein each and every standby generator is accessible by only one dealer at the second hierarchical level.

2. The hierarchically accessible monitoring system of claim 1, further comprising a plurality of sensors, each sensor in communication with one of the interface units.

3. The hierarchically accessible monitoring system of claim 2, wherein each sensor is selected from the group comprising a temperature sensor, a flood sensor, a carbon monoxide sensor, a fire sensor and a freeze sensor.

4. The hierarchically accessible monitoring system of claim 1, wherein at least one of the interface units further comprises a modem.

5. The hierarchically accessible monitoring system of claim 1, wherein at least one of the interface units further comprises a telephone dialer.

6. The hierarchically accessible monitoring system of claim 5, wherein at least one of the telephone dialers is configured to be activated to dial a pre-programmed destination number, and to transmit a pre-programmed message.

7. The hierarchically accessible monitoring system of claim 1, wherein at least one of the interface units further comprises a RF transmitter.

8. The hierarchically accessible monitoring system of claim 1, wherein at least one of the interface units further comprises a microprocessor.

9. The hierarchically accessible monitoring system of claim 1, wherein at least one of the interface units further comprises local memory storage.

10. The hierarchically accessible monitoring system of claim 1, wherein each user interface is selected from the group comprising a laptop computer, a desktop computer, a personal data assistant (PDA), a cell phone, a facsimile machine, a service center, and a second home phone.

11. The hierarchically accessible monitoring system of claim 1, wherein at least one of the interface units comprises a broadband interface unit.

12. The hierarchically accessible monitoring system of claim 1, wherein at least one of the interface units includes communication with the remote data server via a network.

13. The hierarchically accessible monitoring system of claim 1, wherein at least one of the interface units further comprises a receptacle for accepting a diagnostic tool.

14. The hierarchically accessible monitoring system of claim 1, wherein at least one of the interface units is configured to wirelessly access and collect information of the generator.

15. A method of remotely accessing generator information for one or more of a plurality of standby generators, comprising:
providing a plurality of interface units, each unit in communication with one of the plurality of generators;
transmitting a set of generator information through each interface unit to a remote data server;
controlling access to the set of generator information based upon at least three protected hierarchical levels, each hierarchical level associated with the role of one and only one of a manufacturer, a dealer, and a client;
transmitting the set of generator information from the remote data server via a user interface to a user having access privileges based upon the hierarchical level associated with the user, wherein a first of the at least three hierarchical levels is associated with the client and has access privileges to read the set of generator information related to only one of the plurality of standby generators, a second of the at least three hierarchical levels, is associated with the dealer and has access privileges to read the set of generator information related to only a subset of the plurality of standby generators, the subset including more than one standby generator and fewer than all of the plurality of standby generators, the subset including the one of the plurality of standby generators, and a third of the at least three hierarchical levels is associated with the manufacturer and has access privileges to read the set of generator information related to all of the standby generators of the plurality of standby generators, wherein each and every standby generator is accessible by only one dealer at the second hierarchical level.

16. The method of claim 15, further comprising authenticating a user as having access privileges to a hierarchical level.

17. The method of claim 15, further comprising:
selectively sending a notification of a generator event to the user, wherein the user is a member of one of the first of the at least three hierarchical levels and the second of the at least three hierarchical levels.

18. The method claim 15 further comprising
searching the stored generator information by a user having the third level of hierarchical privileges.

19. The method of claim 18, wherein the searching step further comprises sorting the information based on geographical area.

20. The method of claim 18, wherein the searching step further comprises sorting the information based on dealer name.

21. The method of claim 18, wherein the searching step further comprises sorting the information based on a parameter of the generator.

\* \* \* \* \*